(12) United States Patent
Ogasawara

(10) Patent No.: US 11,361,898 B2
(45) Date of Patent: Jun. 14, 2022

(54) COIL COMPONENT AND ELECTRONIC DEVICE

(71) Applicant: TAIYO YUDEN CO., LTD., Tokyo (JP)

(72) Inventor: Jun Ogasawara, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 327 days.

(21) Appl. No.: 16/546,909

(22) Filed: Aug. 21, 2019

(65) Prior Publication Data

US 2020/0075226 A1  Mar. 5, 2020

(30) Foreign Application Priority Data

Aug. 31, 2018  (JP) .............................. JP2018-163410

(51) Int. Cl.
*H01F 27/28* (2006.01)
*H01F 27/24* (2006.01)
(Continued)

(52) U.S. Cl.
CPC ....... *H01F 27/2823* (2013.01); *H01F 27/022* (2013.01); *H01F 27/24* (2013.01);
(Continued)

(58) Field of Classification Search
USPC ................................................ 336/192, 198
See application file for complete search history.

(56) References Cited

U.S. PATENT DOCUMENTS

2002/0097124 A1  7/2002  Inoue et al.
2013/0135072 A1  5/2013  Inaba
(Continued)

FOREIGN PATENT DOCUMENTS

JP  2002305108 A  10/2002
JP  2005310812 A  11/2005
(Continued)

OTHER PUBLICATIONS

A Notice of Reasons for Refusal issued by the Japanese Patent Office, dated Apr. 5, 2022, for Japanese counterpart application No. 2018-163410. (5 pages).

*Primary Examiner* — Shawki S Ismail
*Assistant Examiner* — Kazi S Hossain
(74) *Attorney, Agent, or Firm* — Law Office of Katsuhiro Arai

(57) ABSTRACT

A coil component includes: a substrate body having a first resin part formed by a resin that contains magnetic grains, and a second resin part joined to the surface of the first resin part and formed by a material that contains resin, and whose insulation property is higher than that of the first resin part; a coil embedded in the first resin part and formed by a conductor having an insulating film; leader parts formed by the conductor and led out from the coil to the second resin part; and terminal parts connected electrically to the leader parts; wherein covered parts of the leader parts, which are covered with the insulating film, are embedded partially in the second resin part, and the second resin part is disposed between the terminal parts and the first resin part, thereby preventing shorting between the terminal parts.

11 Claims, 19 Drawing Sheets

(51) Int. Cl.
*H01F 27/02* (2006.01)
*H05K 1/18* (2006.01)
*H01F 27/29* (2006.01)

(52) U.S. Cl.
CPC ........... *H01F 27/292* (2013.01); *H05K 1/181* (2013.01); *H05K 2201/1003* (2013.01)

(56) References Cited

U.S. PATENT DOCUMENTS

| | | | |
|---|---|---|---|
| 2014/0253275 A1* | 9/2014 | Shijo | H01F 27/022 336/105 |
| 2017/0162319 A1* | 6/2017 | Otani | H01C 7/18 |
| 2017/0186528 A1* | 6/2017 | Otsubo | H01F 41/041 |
| 2018/0012698 A1* | 1/2018 | Nakatsuji | H01F 27/323 |
| 2019/0088413 A1* | 3/2019 | Kawaguchi | H01F 17/0013 |
| 2019/0189341 A1* | 6/2019 | Konishi | H01F 38/12 |

FOREIGN PATENT DOCUMENTS

| | | |
|---|---|---|
| JP | 2009200435 A | 9/2009 |
| JP | 2012060053 A | 3/2012 |
| JP | 2016167576 A | 9/2016 |
| JP | 2017183678 A | 10/2017 |
| JP | 2017199732 A | 11/2017 |

\* cited by examiner

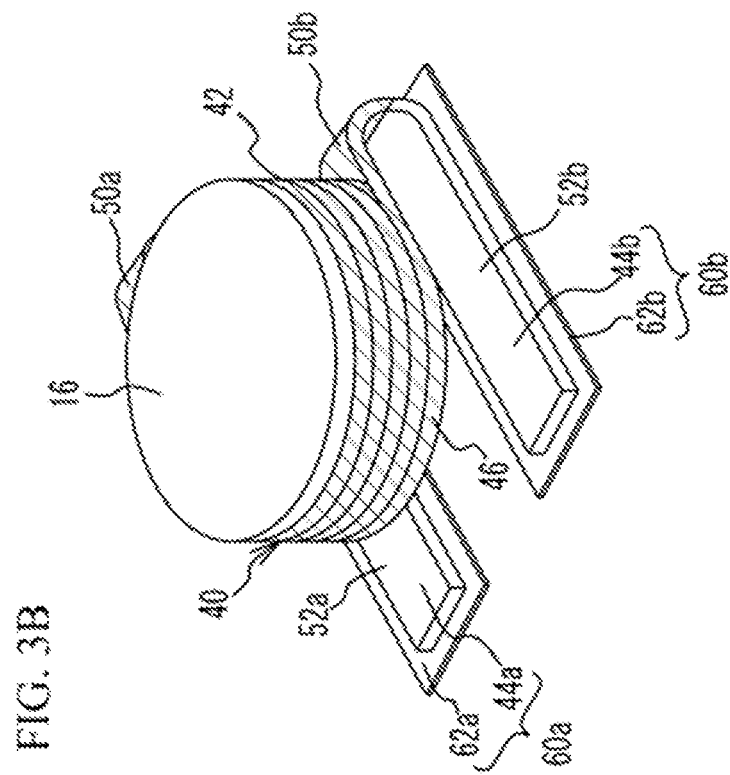
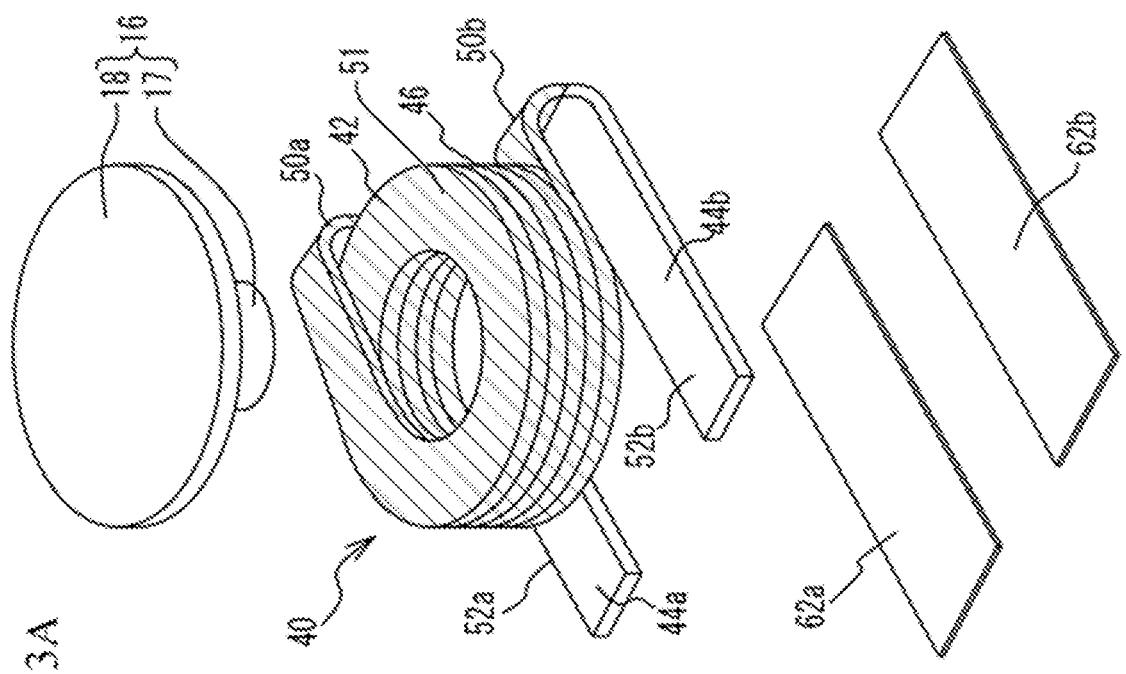

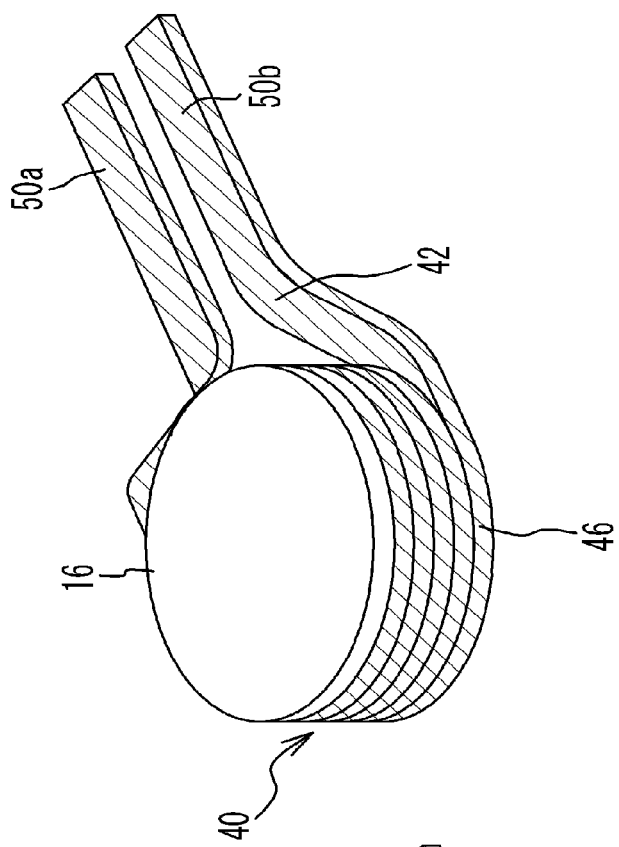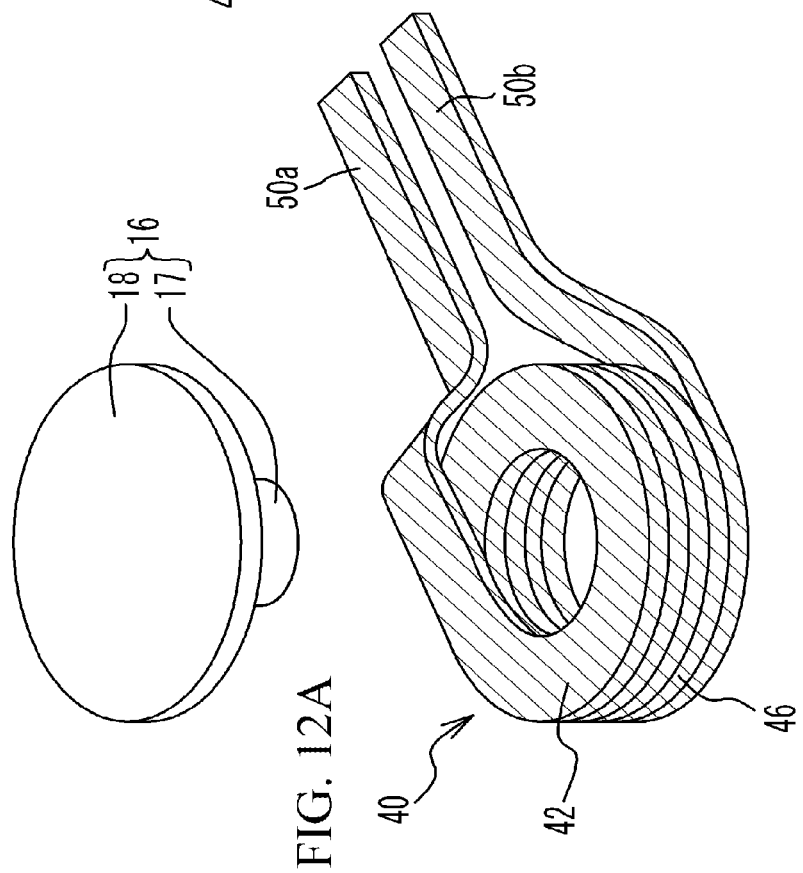

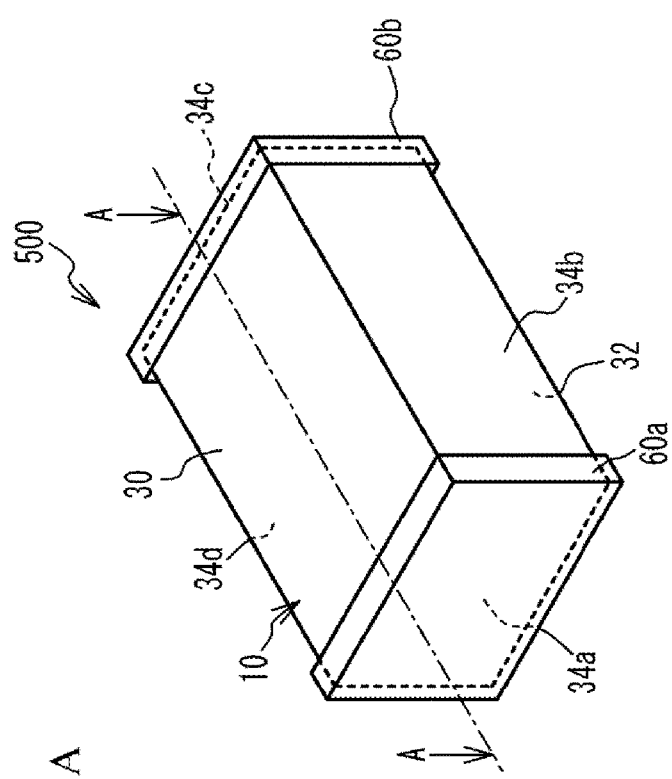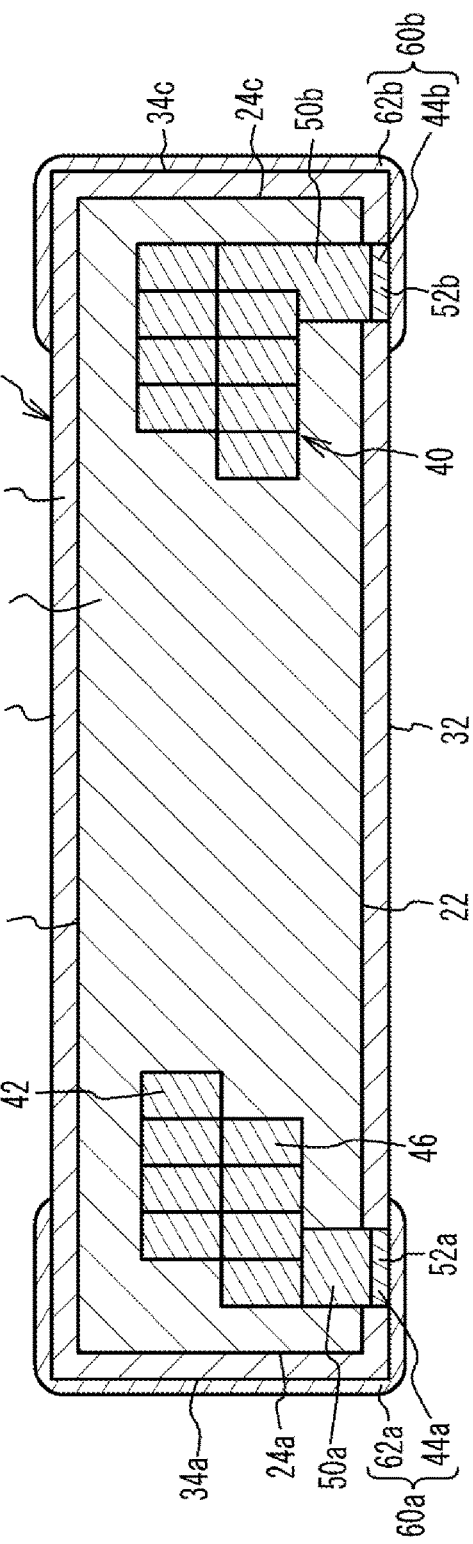
FIG. 16A
FIG. 16B

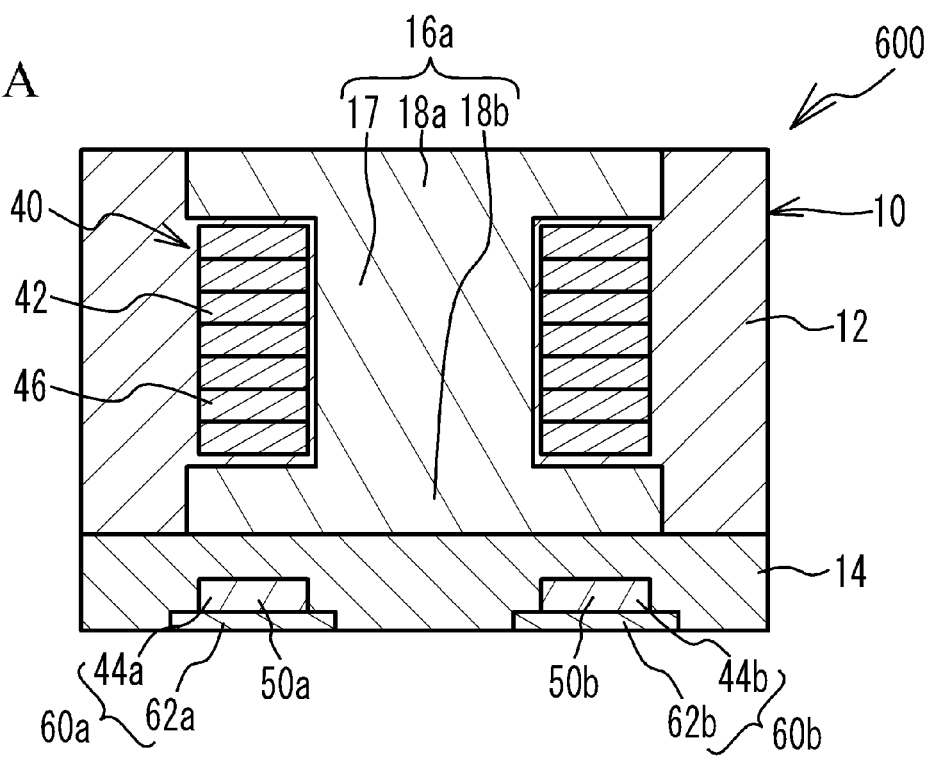
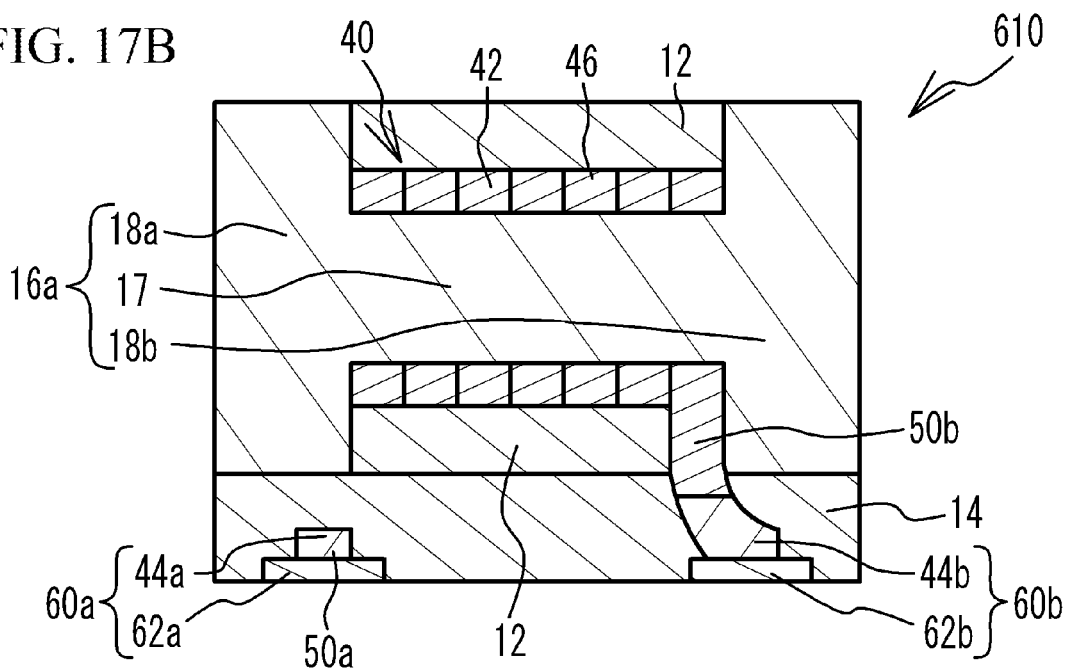

COIL COMPONENT AND ELECTRONIC DEVICE

CROSS-REFERENCE TO RELATED APPLICATIONS

The present application claims priority to Japanese Patent Application No. 2018-163410, Aug. 31, 2018, the disclosure of which is incorporated herein by reference in its entirety including any and all particular combinations of the features disclosed therein.

BACKGROUND

Field of the Invention

The present invention relates to a coil component and an electronic device.

Description of the Related Art

Emergence of higher-performance electronic devices is increasing the number of electronic components used in these electronic devices. As a result, efforts are underway to make electronic components smaller. Among the electronic components used in electronic devices are coil components, each comprising a substrate body made of a resin that contains magnetic grains, and a coil embedded therein which is formed by a conductor. Recent years have seen uses of metal magnetic grains as the magnetic grains, but a substrate body made of a resin that contains metal magnetic grains tends to have lower insulation property compared to a substrate body made of a resin that contains ferrite grains. Furthermore, coil components are also used in circuit boards to which high voltage is applied, in which case high voltage is applied between the terminals of the coil component.

For example, coil components are known whose coil is embedded in a substrate body (resin molded body) and whose terminal part is such that its surface is exposed from the bottom side of the base part while the terminal part is embedded at least partially in its thickness direction in the substrate body (refer to Patent Literature 1, for example). Also known are coil components in which a substrate body housing a coil has a coating film on its surface and an external electrode is provided in an area of the coating film surface where inorganic grains are attached (refer to Patent Literature 2, for example). Additionally, coil components comprising a drum core or ring core around which a coil is formed and which is bonded to a resin base by means of thermosetting adhesive, are known (refer to Patent Literature 3, for example).

BACKGROUND ART LITERATURES

[Patent Literature 1] Japanese Patent Laid-open No. 2009-200435
[Patent Literature 2] Japanese Patent Laid-open No. 2016-167576
[Patent Literature 3] Japanese Patent Laid-open No. 2017-183678

SUMMARY

The present invention represents a coil component comprising: a substrate body having a first resin part formed by a resin that contains magnetic grains, and a second resin part joined to the surface of the first resin part and formed by a material that contains resin, and whose insulation property is higher than that of the first resin part; a coil embedded in the first resin part and formed by a conductor having an insulating film; leader parts formed by the conductor and led out from the coil to the second resin part; and terminal parts connected electrically to the leader parts; wherein covered parts of the leader parts, which are covered with the insulating film, are embedded partially in the second resin part, and the second resin part is disposed between the terminal parts and the first resin part.

The present invention represents an electronic device comprising: the aforementioned coil component; and a circuit board on which the coil component is mounted.

BRIEF DESCRIPTION OF THE DRAWINGS

FIG. 1A is a top view, while

FIGS. 2A and 2B are interior perspective side views, while

FIGS. 3A and 3B are drawings (Part 1) showing how the coil component pertaining to Example 1 is manufactured.

FIGS. 5A and 5B are interior perspective side views, while

FIGS. 11A and 11B are interior perspective side views, while

FIGS. 12A and 12B are drawings (Part 1) showing how the coil component pertaining to Example 4 is manufactured.

FIG. 16A is a perspective view of the coil component pertaining to Example 5, while FIG. 16B is a view of cross-section A-A in FIG. 16A.

FIGS. 17A and 17B are cross-sectional views of the coil components pertaining to Example 6 and Variation Example 1 of Example 6.

DESCRIPTION OF THE SYMBOLS

Figure 1A:
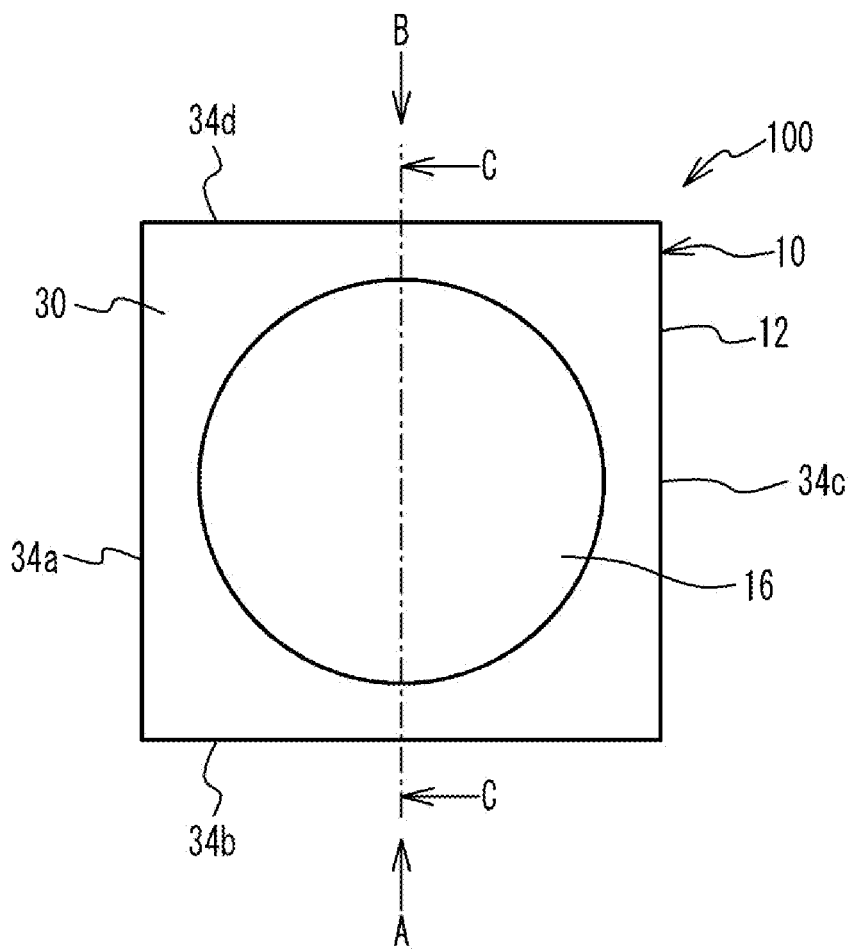

10 Substrate body
12 Resin part
14 Resin part
16, 16a Core
17 Axis of winding
18, 18a, 18b Flange part
20 Top face
22 Bottom face
24a to 24d Side face
30 Top face
32 Bottom face
34a to 34d Side face
40 Coil
42 Conductive wire
44a, 44b Non-covered part
46 Covered part
50a, 50b Lead wire
52a, 52b Tip area
60a, 60b Terminal part
62a, 62b Metal member
66a, 66b Opening
70, 76, 78 Die
72, 74 Resin layer
80 Circuit board
82 Electrode
84 Solder
90 Substrate body
92 Surface discharge
94 Internal discharge
100 to 730 Coil component
800 Electronic device
1000 Coil component

DETAILED DESCRIPTION OF EMBODIMENTS

Examples of the present invention are explained below by referring to the drawings.

Example 1

Figure 1B:
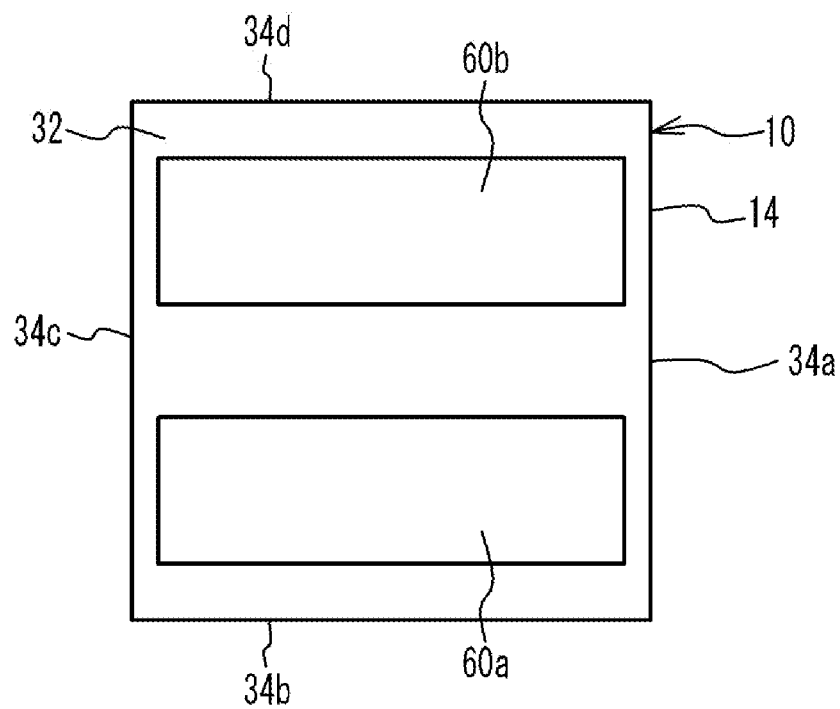
FIG. 1B is a bottom view, of the coil component pertaining to Example 1.
Figure 2A:
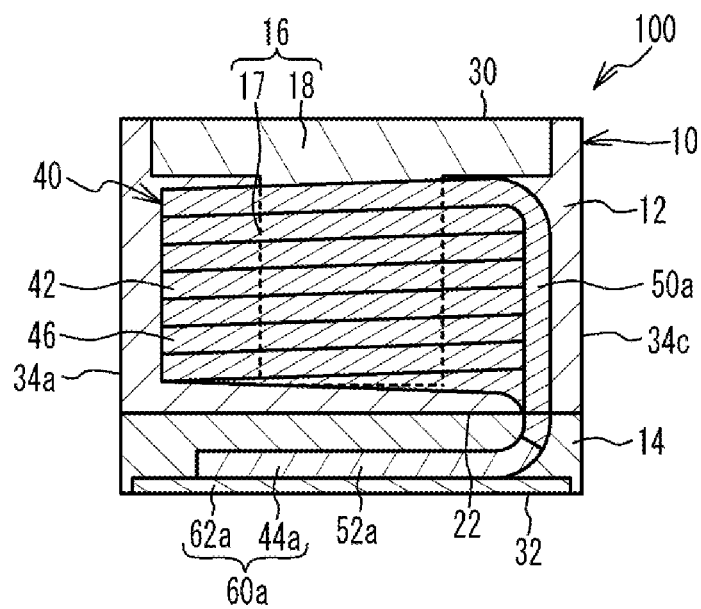
Figure 2B:
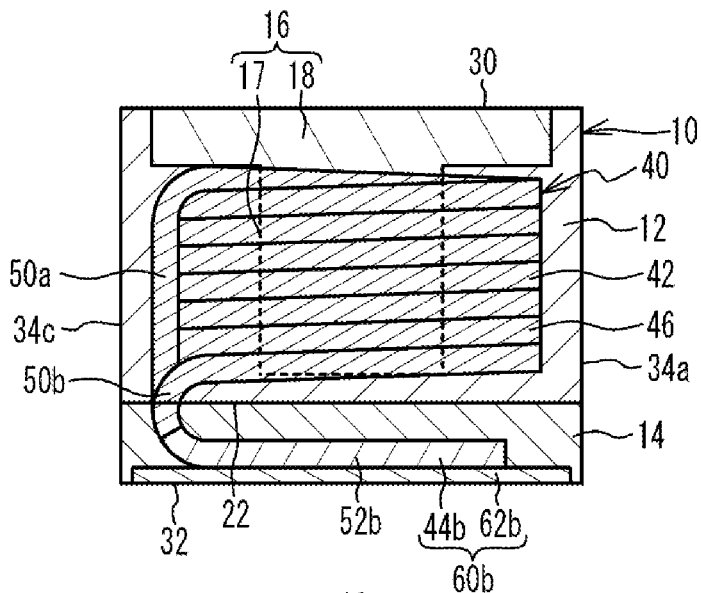
Figure 2C:
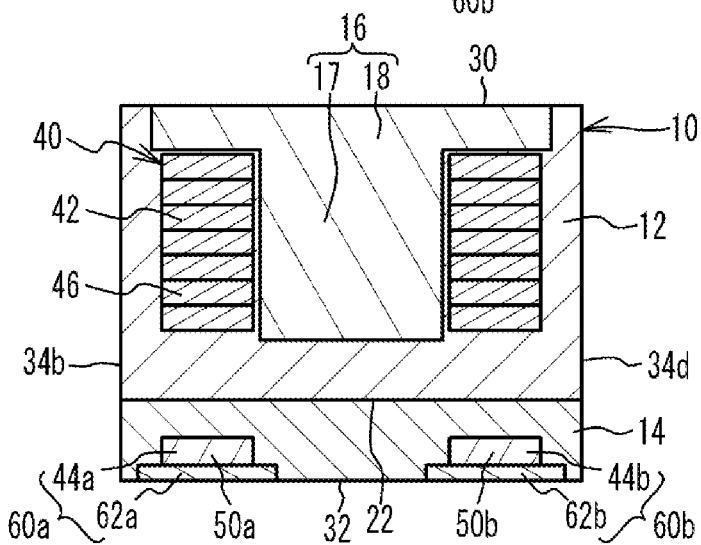
FIG. 2C is a cross-sectional view, of the coil component pertaining to Example 1.

FIG. 1A is a top view, while FIG. 1B is a bottom view, of the coil component pertaining to Example 1. FIGS. 2A and 2B are interior perspective side views, while FIG. 2C is a cross-sectional view, of the coil component pertaining to Example 1. FIG. 2A is an interior perspective side view of FIG. 1A from direction A, FIG. 2B is an interior perspective side view of FIG. 1A from direction B, and FIG. 2C is a view of cross-section C-C in FIG. 1A. It should be noted that, in FIGS. 2A and 2B, each member is hatched for the purpose of illustrative clarity.

As shown in FIGS. 1A and 1B and FIGS. 2A to 2C, the coil component 100 in Example 1 comprises a substrate body 10, a coil 40, a pair of lead wires 50a, 50b, and a pair of terminal parts 60a, 60b.

The substrate body 10 is formed by a resin part 12 and a resin part 14 whose insulation property is higher than that of the resin part 12. The resin part 12 may include a core 16 as part thereof. The core 16 may have higher magnetic permeability than the resin part 12. The resin part 14 is integrally molded with the resin part 12, for example. In other words, the resin part 14 is directly joined to a bottom face 22, or face to be mounted on a circuit board, of the resin part 12. Joining the resin part 14 directly to the resin part 12 ensures joining strength. Also, as explained later in Example 4, the resin part 14 may also be joined directly to the top and side faces of the resin part 12 in addition to the bottom face 22 of the resin part 12, which increases the joining strength further. The resin parts 12, 14 may be prepared as separate, independent members and the resin part 14 may be joined to the bottom face 22 of the resin part 12 with adhesive, etc.; in this case, however, the joining strength of the resin parts 12, 14 will drop because they are not integrally molded. In addition, the lead wires 50a, 50b in the resin part 12, and the lead wires 50a, 50b in the resin part 14, will have to be joined either inside or outside the substrate body 10 because these parts are formed as separate members. For these reasons, joining the resin part 14 to the resin part 12 with adhesive is not desirable. The core 16 includes an axis of winding 17 and a flange part 18 provided on one end of the axis of winding 17 in the axial direction, and is embedded in the resin part 12. It should be noted that the core 16 may be shaped as a drum core (H-core), I-core, etc., in addition to the T-core described above. The axis of winding 17 has a columnar shape, for example, while the flange part 18 has a disk shape with thickness in the axial direction of the axis of winding 17, for example.

The resin part 12 is formed by a resin that contains magnetic grains. The magnetic grains include, for example, those constituted by Ni—Zn, Mn—Zn, and other ferrite materials, Fe—Si—Cr, Fe—Si—Al, Fe—Si—Cr—Al, and other soft magnetic alloy materials, Fe, Ni, and other magnetic metal materials, amorphous magnetic metal materials, nanocrystal magnetic metal materials, and the like. If these magnetic grains are constituted by soft magnetic alloy materials, magnetic metal materials, amorphous metal materials, or nanocrystal magnetic metal materials, these grains may be given insulation treatment on their surface. The resins that may be used include, for example, epoxy resins, silicone resins, phenolic resins, and other thermosetting resins, as well as polyamide resins, fluororesins, and other thermoplastic resins. For the resin part 12, a resin whose heat resistance is greater than the maximum allowable temperature of the coil component is selected.

For the resin part 14, a resin that provides greater insulation than the resin part 12 is selected. As with the resin part 12, epoxy resins, silicone resins, phenolic resins, and other thermosetting resins, as well as polyamide resins, fluororesins, and other thermoplastic resins, may also be used, for example. For the resin part 14, too, a resin whose heat resistance is greater than the maximum allowable temperature of the coil component is selected. The resin part 14 may have inorganic grains from silicone oxide, aluminum oxide, titanium oxide, zinc oxide, and the like, added to it as a filler, in order to align its thermal expansion coefficient with that of the resin part 12. The resin part 14 may or may not contain magnetic grains so long as it has higher insulation property than the resin part 12. If the resin part 14 contains magnetic metal grains from soft magnetic alloy material, magnetic metal material, amorphous magnetic metal material, nanocrystal magnetic metal material, and the like, the filling rate of the magnetic metal grains is preferably 70 percent by weight or lower, or more preferably 60 percent by weight or lower, or yet more preferably 50 percent by weight or lower, from the viewpoint of insulation property. Preferably the resin that forms the resin part 14 is the same material as the resin that forms the resin part 12, but they may also be different materials.

The core 16 is formed by a material that contains magnetic material; specifically, it is formed by a ferrite material, magnetic metal material, or resin that contains magnetic material. For example, the core 16 is formed by Ni—Zn, Mn—Zn, or other ferrite material, Fe—Si—Cr, Fe—Si—Al, Fe—Si—Cr—Al, or other soft magnetic alloy material, Fe, Ni, or other magnetic metal material, amorphous magnetic metal material, nanocrystal magnetic metal material, or resin that contains any of the foregoing. If the core 16 is formed by soft magnetic alloy material, magnetic metal material, amorphous magnetic metal material, or nanocrystal magnetic metal material, its grains may be given insulation treatment on their surface. It should be noted that not providing the core 16 is also an option.

The substrate body 10 is shaped as a rectangular solid, for example. Also, the substrate body 10 may be a quadrilateral frustum or have other shape. The length of one side of a top face 30 and bottom face 32 of the substrate body 10 is approx. 4.0 mm, for example. The height of the substrate body 10 (length between the top face 30 and the bottom face 32) is approx. 3.0 mm, for example. The bottom face 32 is a mounting surface which will be mounted on a circuit board, while the top face 30 is the face on the opposite side of the bottom face 32. The faces that connect to the top face 30 and bottom face 32 are side faces 34a to 34d.

The coil 40 is formed by winding a conductive wire 42 which is a metal wire covered with an insulating film (which is represented by narrow-ruled hatching with reference number 51 as in FIG. 3A), and embedded in the resin part 12 of the substrate body 10. The coil 40 is embedded entirely in the resin part 12, for example, but it may also be embedded at least partially in the resin part 12. The coil 40 is not exposed to the outside of the resin part 12, for example. Both ends of the conductive wire 42 are led out from the coil 40 to become the lead wires 50a, 50b. The lead wires 50a, 50b are led out continuously from the coil 40, through the resin part 12, to the resin part 14. Because the lead wires 50a, 50b are led out continuously from the resin part 12 to the resin part 14, no lead wire joints are formed on the outside of the resin parts 12, 14, which reduces the joining man-hours and also eliminates the need for taking insulation measures at the joints.

The coil 40 is formed by winding edge-wise a conductive wire 42 comprising a rectangular wire whose cross-section shape is rectangular, for example, but how it is formed is not limited to the foregoing. The coil 40 may also be formed by winding the conductive wire 42 by alpha-winding or other winding method. Also, the conductive wire 42 is not limited to a rectangular wire; for example, it may be a round wire whose cross-section shape is circular, or it may have other shape.

The conductive wire 42 has a covered part where the metal wire is covered with the insulating film, and non-covered parts where the metal wire is not covered with the insulating film. A tip area 52a of the lead wire 50a, and a tip area 52b of the lead wire 50b, represent the non-covered parts 44a, 44b where the metal wire is not covered with the insulating film but is exposed. The parts of the conductive wire 42 other than the tip areas 52a, 52b of the lead wires 50a, 50b, represent a covered part 46 where the metal wire is covered with the insulating film. Accordingly, the coil 40 is formed by winding the covered part 46 of the conductive wire 42. The material of the metal wire is copper, copper alloy, silver, palladium, and the like, for example, but other metal material may also be used. The material of the insulating film is polyester imide, polyamide, or other resin material, for example, but other resin material may also be used.

The lead wires 50a, 50b are led out from the resin part 12 into the resin part 14. In one example, the lead wires 50a, 50b are bent in such a way that, near the bottom face 32 of the substrate body 10, they run parallel with the bottom face 32; however, bending them is not absolutely necessary. Because the lead wires 50a, 50b are bent, the height of the component as a whole can be lowered. Additionally, because the lead wires 50a, 50b are bent, constituting the terminal parts 60a, 60b with the tip areas 52a, 52b, which are the non-covered parts 44a, 44b, of the lead wires 50a, 50b, also becomes possible, as in Example 3 described later. The lead wires 50a, 50b run through the boundary between the resin parts 12, 14 at the covered part 46 where the metal wire is covered with the insulating film. Accordingly, the lead wires 50a, 50b are embedded partially in the resin part 14 at the covered part 46. The tip areas 52a, 52b, which are the non-covered parts 44a, 44b, of the lead wires 50a, 50b are embedded in the resin part 14, and in one example, they extend in parallel with the bottom face 32 of the substrate body 10 along the bottom face 32. It should be noted that "parallel" is not limited to a case of perfect parallelism between the tip areas 52a, 52b of the lead wires 50a, 50b and the bottom face 32 of the substrate body 10. For example, it also includes cases of approximate parallelism, such as a small offset from parallelism due to manufacturing error, with the tip areas 52a, 52b of the lead wires 50a, 50b tilted by 10° or less relative to the bottom face 32 of the base part 10.

The non-covered parts 44a, 44b of the lead wires 50a, 50b are embedded entirely in the resin part 14 and not exposed to the outside of the resin part 14, in one example. Even when the terminal parts 60a, 60b are constituted by the non-covered parts 44a, 44b of the lead wires 50a, 50b, as in Example 3 described later, the non-covered parts 44a, 44b, except for the areas that function as the terminal faces, are embedded entirely in the resin part 14 and not exposed to the outside of the resin part 14. Accordingly, the non-covered parts 44a, 44b of the lead wires 50a, 50b are not in contact with the resin part 12. In contact with the resin part 12 is the covered part 46 representing the part of the conductive wire 42 where the metal wire is covered with the insulating film.

The terminal part 60a comprises the non-covered part 44a of the lead wire 50a and a metal member 62a joined to the non-covered part 44a, and is embedded in the resin part 14, in one example. In this example, the metal member 62a is joined to the non-covered part 44a of the lead wire 50a inside the resin part 14. The terminal part 60b comprises the non-covered part 44b of the lead wire 50b and a metal member 62b joined to the non-covered part 44b, and is embedded in the resin part 14, in one example. In this example, the metal member 62b is joined to the non-covered part 44b of the lead wire 50b inside the resin part 14. Because the lead wires 50a, 50b are bent near the bottom face 32 of the substrate body 10, the joining areas of the non-covered parts 44a, 44b of the lead wires 50a, 50b, and the metal members 62a, 62b, can be increased to ensure joining. It should be noted that, as in Example 3 described later, the terminal parts 60a, 60b may be constituted by the non-covered parts 44a, 44b of the lead wires 50a, 50b, without using the metal members 62a, 62b. Preferably the metal members 62a, 62b are formed by a material having high electrical conductivity and high mechanical rigidity, where, for example, a copper plate, copper alloy plate, or other metal plate of approx. 0.05 mm to 0.2 mm in thickness is preferred. For the joining of the metal members 62a, 62b and the non-covered parts 44a, 44b of the lead wires 50a, 50b, any generally known metal-on-metal joining method, such as solder joining, laser welding, pressure bonding, ultrasonic joining, and the like, may be used.

The metal members 62a, 62b are positioned on the opposite side of the resin part 12 with respect to the non-covered parts 44a, 44b of the lead wires 50a, 50b, and embedded in the resin part 14 in such a way that their bottom faces are exposed from the bottom face 32 of the substrate body 10. Since the non-covered parts 44a, 44b of the lead wires 50a, 50b are not in contact with the resin part 12, the metal members 62a, 62b are not in contact with the resin part 12, either. In other words, the resin part 14 is disposed between the non-covered part 44a of the lead wires 50a and the metal member 62a, which will constitute the terminal part 60a, and the resin part 12, while the resin part 14 is also disposed between the non-covered part 44b of the lead wires 50b and the metal member 62b, which will constitute the terminal part 60b, and the resin part 12. It should be noted that, so long as their bottom faces are exposed from the bottom face 32 of the substrate body 10, the metal members 62a, 62b may be embedded entirely, except for the bottom faces, in the resin part 14 of the substrate body 10, or they may be embedded partially in the resin part 14 in their thickness direction. The bottom face of the metal members 62a, 62b may be flush with the bottom face 32 of the substrate body 10, for example. It should be noted that, even when the metal members 62a, 62b are not used and the terminal parts 60a, 60b are constituted by the non-covered parts 44a, 44b of the lead wires 50a, 50b, as in Example 3 described later, the terminal parts 60a, 60b are embedded in the resin part 14 in such a way that only their non-covered parts 44a, 44b, or areas that function as the terminal faces, are exposed from the bottom face 32 of the substrate body 10. Since the non-covered parts 44a, 44b of the lead wires 50a, 50b are not in contact with the resin part 12, the terminal parts 60a, 60b are not in contact with the resin part 12, either, in Example 3 described later. This means that, also in Example 3 described later, the resin part 14 is disposed between the non-covered part 44a of the lead wires 50a, which will constitute the terminal part 60a, and the resin part 12, while the resin part 14 is also disposed between the non-covered part 44b of the lead wires 50b, which will constitute the terminal part 60b, and the resin part 12.

Next, how the coil component 100 in Example 1 is manufactured, is explained. FIGS. 3A to 4C are drawings showing how the coil component pertaining to Example 1 is manufactured. It should be noted that, for the purpose of illustrative clarity, the covered part 46 representing the part of the conductive wire 42 where the metal wire is covered with the insulating film is hatched in FIGS. 3A and 3B, while each member is hatched in FIGS. 4A to 4C. As shown in FIGS. 3A and 3B, first a conductive wire 42 constituted by a rectangular wire is wound edge-wise to form a coil 40, and two lead wires 50a, 50b running straight and roughly parallel to each other are led out from the coil 40 by an appropriate length. Next, the insulating film is stripped at the tip area 52a of the lead wire 50a and tip area 52b of the lead wire 50b, to produce non-covered parts 44a, 44b where the metal wire is exposed. The insulating film may be stripped by irradiating laser beam, using a cutting knife, applying a chemical reagent, and the like.

Next, a forming process to bend the lead wires 50a, 50b is performed, so that the tip areas 52a, 52b of the lead wires 50a, 50b are positioned on the same side with respect to the coil 40 and become roughly parallel to each other. Next, a metal member 62a is joined to the non-covered part 44a of the lead wire 50a, while a metal member 62b is joined to the non-covered part 44b of the lead wire 50b. The metal members 62a, 62b may be joined by, for example, solder joining, laser welding, pressure bonding, ultrasonic joining, and the like. The non-covered parts 44a, 44b of the lead wires 50a, 50b and metal members 62a, 62b joined to the non-covered parts 44a, 44b become terminal parts 60a, 60b. Next, a core 16 having an axis of winding 17 and a flange part 18 is installed in the coil 40, with the axis of winding 17 inserted into the hollow core part of the coil 40.

Figure 4A:
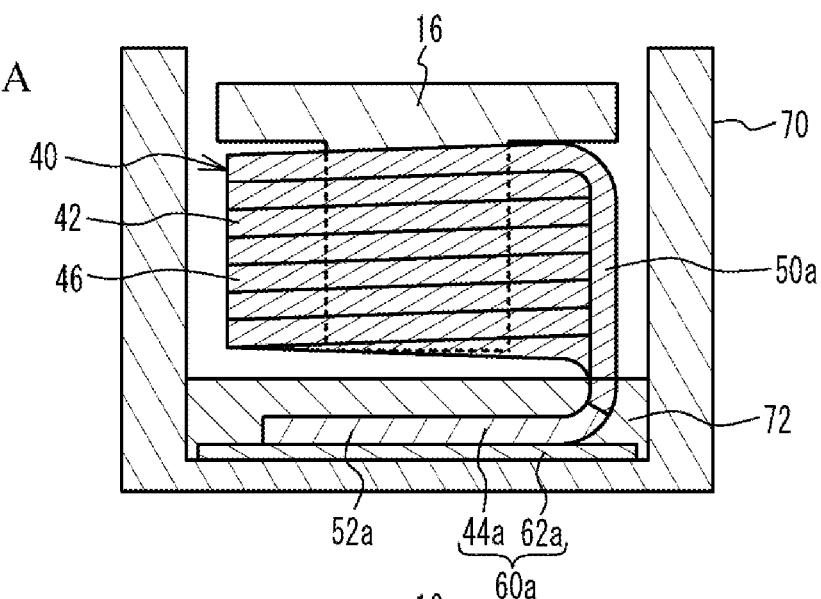
FIGS. 4A to 4C are drawings (Part 2) showing how the coil component pertaining to Example 1 is manufactured.

As shown in FIG. 4A, the coil 40 in which the core 16 has been installed is set in a die 70. Then, a liquid resin for forming resin part 14 is injected into the die 70 using a dispenser, and the like. At this time, the liquid resin is injected until the non-covered parts 44a, 44b of the lead wires 50a, 50b are completely embedded. Thereafter, the liquid resin that has been filled in the die 70 is tentatively cured. The tentative curing may be implemented under the condition of maintaining 150° C. for 5 minutes, for example, if a thermosetting resin is used for the liquid resin for forming resin part 14. This way, a resin layer 72, where the liquid resin for forming resin part 14 is held in shape, is formed. It should be noted that a defoaming step to remove air bubbles from the liquid resin that has been filled in the die 70, may be performed prior to the tentative curing.

Figure 4B:
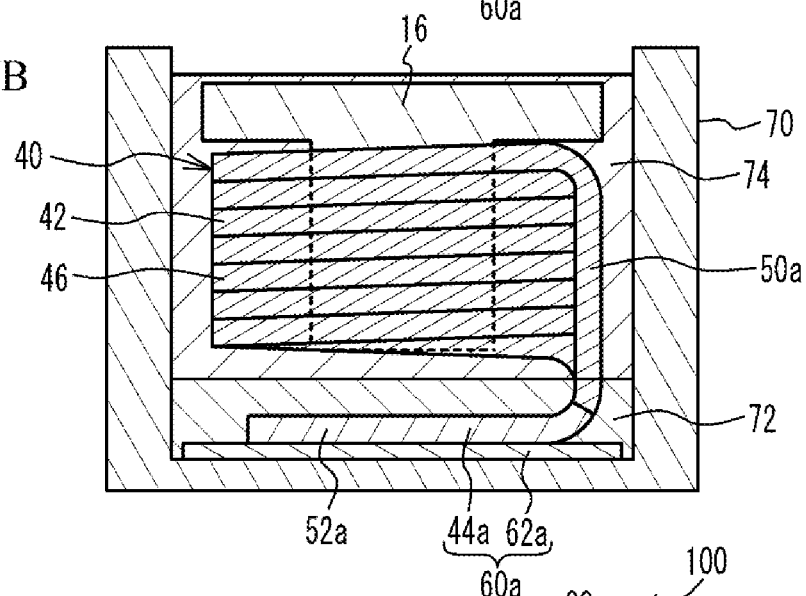

As shown in FIG. 4B, a magnetic-grain-containing liquid resin for forming resin part 12 is injected into the die 70 using a dispenser, and the like. At this time, the magnetic-grain-containing liquid resin is injected until the core 16 is completely embedded. Thereafter, the magnetic-grain-containing liquid resin that has been filled in the die 70 is tentatively cured. The tentative curing may be implemented under the condition of maintaining 150° C. for 5 minutes, for example, if a thermosetting resin is used for the magnetic-grain-containing liquid resin for forming resin part 12. This way, a resin layer 74, where the magnetic-grain-containing liquid resin that has been filled in the die 70 is held in shape, is formed.

Figure 4C:
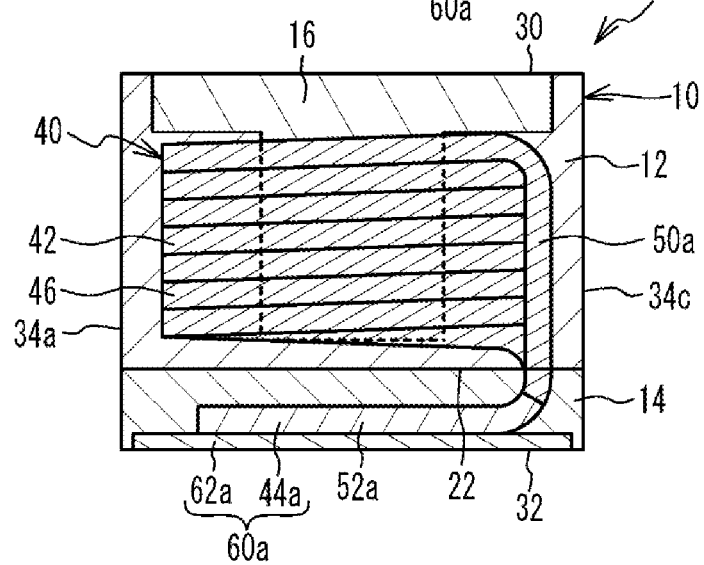

As shown in FIG. 4C, the molded body is taken out of the die 70 and, after the necessary faces are polished to remove excess areas from the resin layers 72, 74, the resin layers 72, 74 are finally cured. The final curing may be performed under conditions involving higher temperatures and longer times compared to the tentative curing, if the resin layers 72, 74 are constituted by a thermosetting resin; for example, it may be performed under the condition of maintaining 180° C. for 60 minutes. This way, a coil component 100 is formed that comprises an integrally-molded substrate body 10 which, in turn, comprises a resin part 12 in which the core 16 and coil 40 have been embedded, and a resin part 14 in which the terminal parts 60a, 60b constituted by the non-covered parts 44a, 44b of the lead wires 50a, 50b and also by the metal members 62a, 62b have been embedded. If the resin layers 72, 74 are integrally molded, use of a filler offering high thermal conductivity can improve the thermal conduction of the cured areas. Accordingly, in the resin curing process even for a substrate body 10 whose resin layers 72, 74 contain a filler by different additive quantities, the overall temperature can be kept uniform with ease and the curing rates can be aligned, which leads to greater integral molding strength.

It should be noted that, if a thermoplastic resin is used for the resin layers 72, 74, the liquid resin for forming resin part 14 is heated and injected, and then cooled to some extent (cooled by 50° C., for example), to tentatively cure the liquid resin for forming resin part 14 and thereby form a resin layer 72. The magnetic-grain-containing liquid resin for forming resin part 12, which is injected next, is injected after being heated to a higher temperature than that of the liquid resin for forming resin part 14 so that the boundary areas between the resin layer 72 and the magnetic-grain-containing liquid resin for forming resin part 12 become fluid, which is then followed by cooling to achieve integral curing with the resin layer 72. If a thermoplastic resin is used, aligning the curing temperatures of the respective resin parts allows for simultaneous curing of resin, which leads to even greater integral molding strength.

It should be noted that both of the resin layers 72, 74 need not be a thermosetting resin or thermoplastic resin. A thermosetting resin may be used for one of the resin layers 72, 74, with a thermoplastic resin used for the other. Also, the resin layers 72, 74 need not be formed in this order. By setting a die opening area at a desired position such as a position on a lower side, lateral side, or upper side of the die, or the like, or by using a die that has no opening area but has an openable/closable face, the resin layers 72, 74 may be formed in a desired order.

Figure 5A:
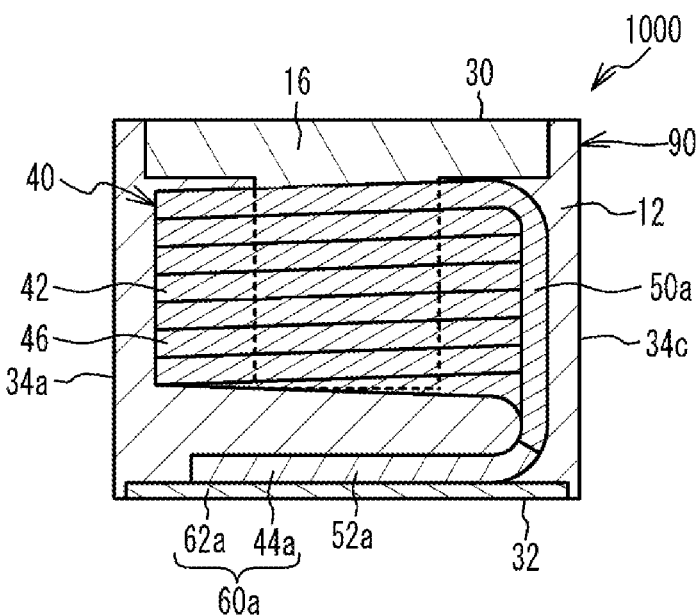
Figure 5B:
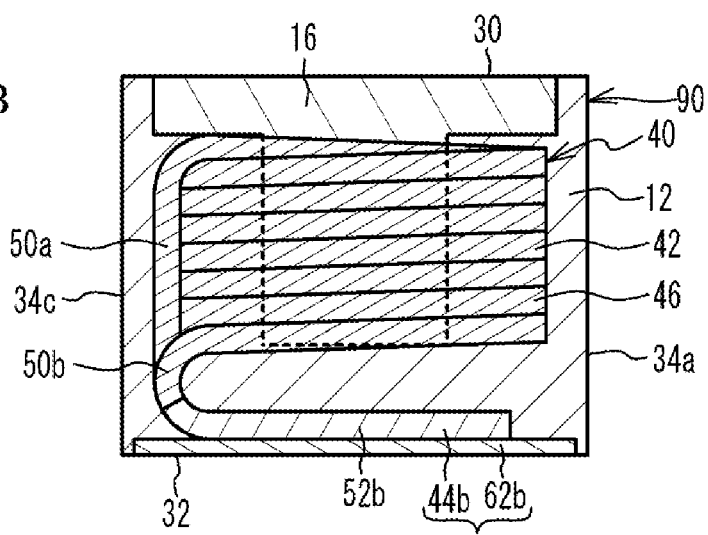
Figure 5C:
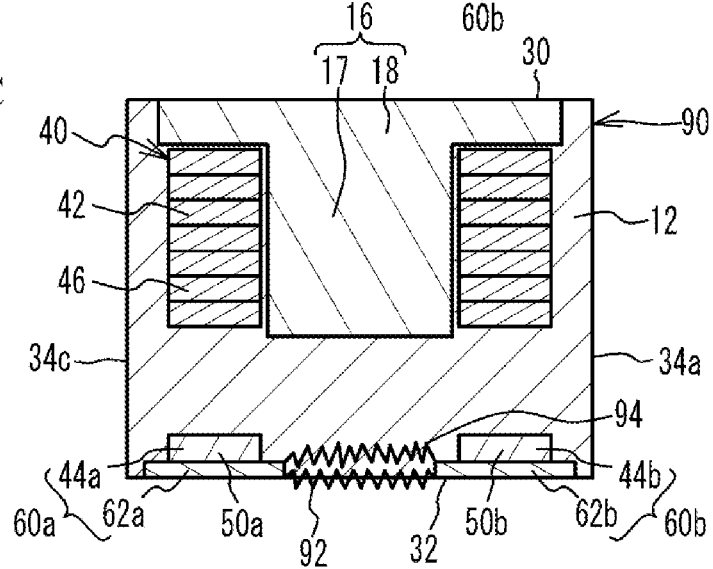
FIG. 5C is a cross-sectional view, of the coil component pertaining to Comparative Example 1.

In explaining the effects of the coil component 100 in Example 1, the coil component in Comparative Example 1 is explained. FIGS. 5A and 5B are interior perspective side views, while FIG. 5C is a cross-sectional view, of the coil component pertaining to Comparative Example 1. It should be noted that, in FIGS. 5A and 5B, each member is hatched for the purpose of illustrative clarity. As shown in FIGS. 5A to 5C, the coil component 1000 in Comparative Example 1 has a substrate body 90 formed only by the resin part 12. Accordingly, the lead wires 50a, 50b are routed inside the resin part 12. The tip areas 52a, 52b, representing the non-covered parts 44a, 44b, of the lead wires 50a, 50b are embedded in the resin part 12 and extend in the resin part 12 in parallel with the bottom face 32 of the substrate body 90 along the bottom face 32. The terminal parts 60a, 60b, constituted by the non-covered parts 44a, 44b of the lead wires 50a, 50b and metal members 62a, 62b joined to the non-covered parts 44a, 44b, are embedded in the resin part 12. Accordingly, the terminal parts 60a, 60b are in contact with the resin part 12. The remaining constitutions are the same as those in Example 1 and therefore not explained.

In Comparative Example 1, the terminal parts 60a, 60b are embedded in the resin part 12 and in contact with the resin part 12. This means that, when the distance between the terminal parts 60a, 60b is shortened to make the coil component smaller, surface discharge 92 and/or internal discharge 94 may occur between the terminal parts 60a, 60b via the resin part 12, and especially when high voltage is applied, surface discharge 92 and/or internal discharge 94 occurs easily. Surface discharge 92 and/or internal discharge 94 leads to shorting between the terminal parts 60a, 60b. To prevent shorting between the terminal parts 60a, 60b, the content of magnetic grains in the resin part 12 can be reduced to improve the insulation property of the resin part 12; however, doing so leads to degradation of coil characteristics.

According to Example 1, on the other hand, the resin part 14 is disposed between the terminal part 60a and the resin part 12, while the resin part 14 is also disposed between the terminal part 60b and the resin part 12, as shown in FIGS. 2A to 2C. Since the resin part 14 has higher insulation property than the resin part 12, surface discharge on the surface of the resin part 14, internal discharge inside the resin part 14, or surface discharge via the boundary between the resin parts 12, 14, does not occur easily between the terminal parts 60a, 60b, even when high voltage is applied to the terminal parts 60a, 60b. As a result, shorting between the terminal parts 60a, 60b can be prevented. In addition, since the insulation property of the resin part 14 can be adjusted separately from the resin part 12 in which the coil 40 is embedded, an appropriate material can be selected for the resin part 12 in consideration of coil characteristics. This means that shorting between the terminal parts 60a, 60b can be prevented while achieving good coil characteristics. It should be noted that, while Example 1 illustrated an example where the resin part 14 is disposed between the terminal part 60a and the resin part 12 and also between the terminal part 60b and the resin part 12, shorting between the terminal parts 60a, 60b can be prevented so long as the resin part 14 is disposed at least between one of the pairs. It should be noted that similar effects can also be achieved in Example 3 described later, where the metal members 62a, 62b are not used and the terminal parts 60a, 60b are constituted by the non-covered parts 44a, 44b of the lead wires 50a, 50b.

Since the coil 40 is embedded in the resin part 12, preferably the resin part 12 is formed by a resin that contains magnetic metal grains constituted by soft magnetic alloy material, magnetic metal material, amorphous magnetic metal material, or nanocrystal magnetic metal material, when coil characteristics are considered. Although the insulation property of the resin part 12 tends to drop in this case, shorting between the terminal parts 60a, 60b can be prevented because the resin part 14 is disposed between the terminal part 60a and the resin part 12, and also between the terminal part 60b and the resin part 12. It should be noted that the same applies in Example 3 described later, where the metal members 62a, 62b are not used and the terminal parts 60a, 60b are constituted by the non-covered parts 44a, 44b of the lead wires 50a, 50b.

The resin part 14 may be formed by a resin that contains magnetic grains, but preferably it is formed by a resin that does not contain magnetic grains because it increases the insulation property.

Figure 6:
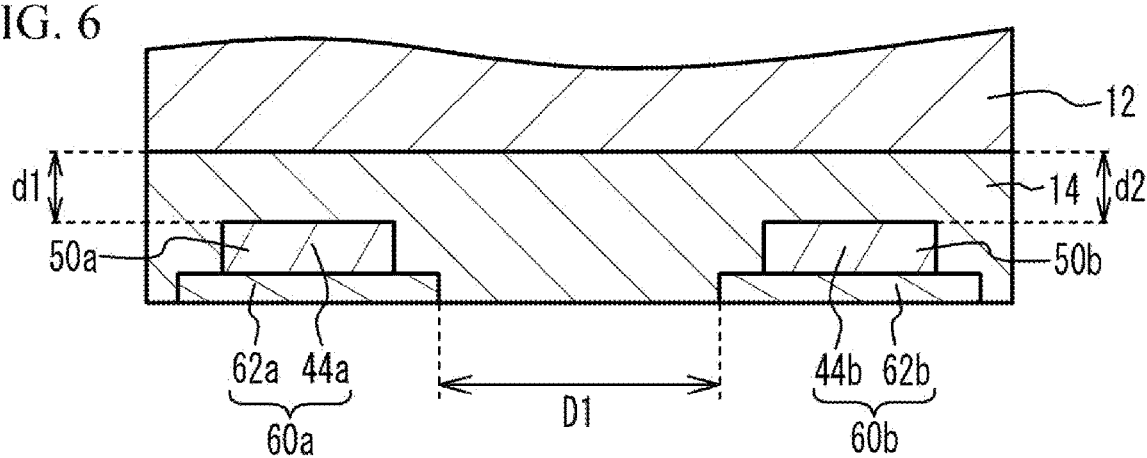
FIG. 6 is a cross-sectional view showing an enlarged detail near the terminal parts of the coil component pertaining to Example 1.

FIG. 6 is a cross-sectional view showing an enlarged detail near the terminal parts of the coil component pertaining to Example 1. As shown in FIG. 6, the shortest distance between the terminal part 60a constituted by the non-covered part 44a of the lead wire 50a and metal member 62a joined to the non-covered part 44a, and the terminal part 60b constituted by the non-covered part 44b of the lead wire 50b and metal member 62b joined to the non-covered part 44b, is given by D1 (mm). In other words, the shortest distance between the non-covered part 44a of the lead wire 50a plus the metal member 62a, and the non-covered part 44b of the lead wire 50b plus the metal member 62b, is given by D1 (mm). Also, the sum (d1+d2) of the shortest distance d1 (mm) between the terminal part 60a and the resin part 12, and the shortest distance d2 (mm) between the terminal part 60b and the resin part 12, is given by D2 (mm). In other words, the shorter of the shortest distance between the metal member 62a and the resin part 12 and the shortest distance between the non-covered part 44a of the lead wire 50a and the resin part 12, defines d1 (mm), while the shorter of the shortest distance between the metal member 62b and the resin part 12 and the shortest distance between the non-covered part 44b of the lead wire 50b and the resin part 12, defines d2 (mm). Also, the dielectric strength voltage (sometimes referred to as dielectric strength) of the resin part 14 is given by R (kV/mm), while the dielectric strength voltage of air is assumed as 3 (kV/mm). In this case, preferably the following relationship is satisfied. This is because of the reasons explained below.

$$(3 \times D1)/D2 < R \qquad (1)$$

Namely, Expression (1) above can be rephrased as:

$$3 \times D1 < R \times D2 \qquad (2)$$

The left term of Expression (2) represents a value relating to the withstand voltage between the terminal parts 60a, 60b via air, while the right term represents a value relating to the withstand voltage between the terminal parts 60a, 60b via the resin parts 14, 12. That the right term is greater than the left term in Expression (2) indicates that shorting via the resin parts 14, 12 is less likely to occur than shorting via air, between the terminal parts 60a, 60b. Since shorting between the terminal parts 60a, 60b via air is structurally unavoidable, satisfying Expression (1) above to make shorting via the resin parts 14, 12 less likely to occur than shorting via air, between the terminal parts 60a, 60b, allows for effective prevention of shorting between the terminal parts 60a, 60b.

For example, in Expression (1) above, D1 of 1.4 mm and D2 of 1.0 mm result in 4.2 kV/mm<R, while D1 of 1 mm and D2 of 0.4 mm result in 7.5 kV/mm<R. D1 of 0.5 mm and D2 of 0.2 mm result in 7.5 kV/mm<R, while D1 of 2 mm and D2 of 1 mm result in 6 kV/mm<R. In other words, the dielectric strength voltage R of the resin part 14 is preferably 8 kV/mm or higher, or more preferably 10 kV/mm or higher, or yet more preferably 12 kV/mm or higher. It should be noted that, if the resin part 12 is formed by a resin that contains magnetic metal grains, in many cases the volume resistivity of the resin part 12 is approx. $1\times10^5$ $\Omega\cdot$cm. Additionally, if the resin part 12 is formed by a resin that contains ferrite grains, for example, the volume resistivity of the resin part 12 may become approx. $1\times10^7$ $\Omega\cdot$cm. Based on the above, the volume resistivity of the resin part 14 is preferably $1\times10^{10}$ $\Omega\cdot$cm or higher, or more preferably $1\times10^{11}$ $\Omega\cdot$cm or higher, or yet more preferably $1\times10^{12}$ $\Omega\cdot$cm or higher, from the viewpoint of insulation property.

It should be noted that, in Expression (1) above, the dielectric strength voltage of the resin part 12 can be ignored in the calculations if the resin part 12 is formed by a resin that contains magnetic metal grains, and the resin part 14 is formed by a resin that does not contain magnetic grains, because the dielectric strength voltage of the resin part 12 is sufficiently smaller than the dielectric strength voltage of the resin part 14 or that of air.

As shown in FIGS. 2A to 2C, preferably the terminal parts 60a, 60b are embedded in the resin part 14. This way, shorting between the terminal parts 60a, 60b can be prevented while allowing the height of the coil component 100 to be lowered and the terminal parts 60a, 60b to be protected.

As shown in FIGS. 2A to 2C, preferably the lead wires 50a, 50b penetrate through the boundary between the resin parts 12, 14 at the covered part 46 being covered with the insulating film. This way, contacting of the resin part 12 by the non-covered parts 44a, 44b of the lead wires 50a, 50b can be prevented while allowing reliability to improve compared to when the lead wires 50a, 50b are led out to the outside of the substrate body 10.

As shown in FIGS. 4A to 4C, preferably the substrate body 10 is formed by integrally molding the resin parts 12, 14. This way, a substrate body 10 whose resin parts 12, 14 are joined together to greater joining strength can be achieved.

As shown in FIGS. 2A and 2B, preferably the lead wire 50a is led out from the end-of-winding position of the coil 40 toward the bottom face 32 of the substrate body 10 in a manner extending roughly vertically to the bottom face 32 of the substrate body 10. This allows the coil component 100 to be made smaller, and also its electrical resistance to be kept low because the length of the lead wire 50a can be shortened. It should be noted that, if the lead wire 50b is long, preferably it is led out from the end-of-winding position of the coil 40 toward the bottom face 32 of the substrate body 10 in a manner extending roughly vertically to the bottom face 32 of the substrate body 10, just like the lead wire 50a.

Figure 7A:
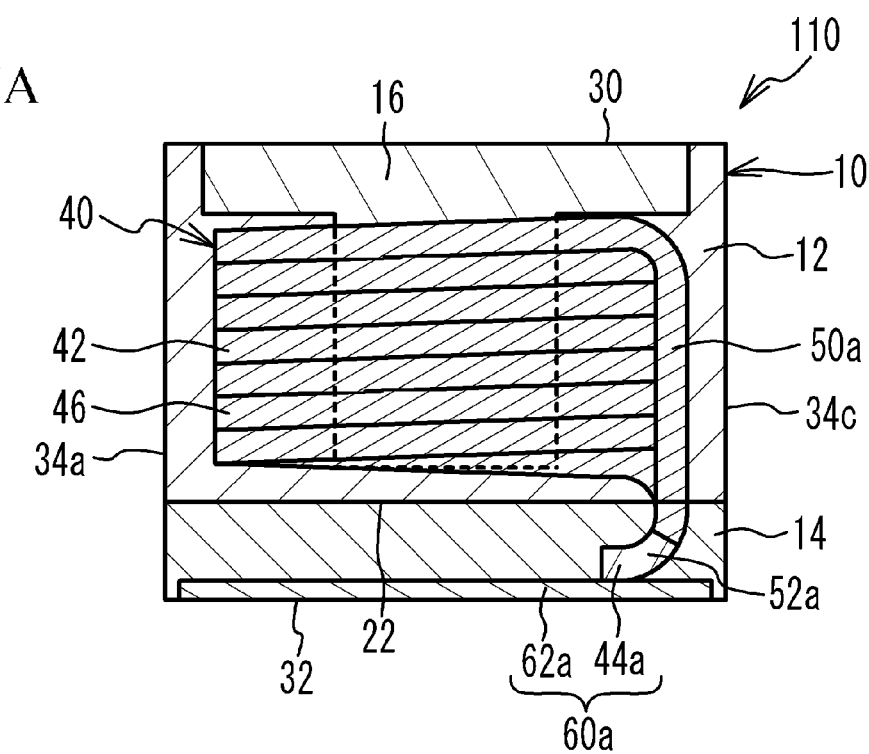
FIGS. 7A and 7B are interior perspective side views of the coil component pertaining to Variation Example 1 of Example 1.
Figure 7B:
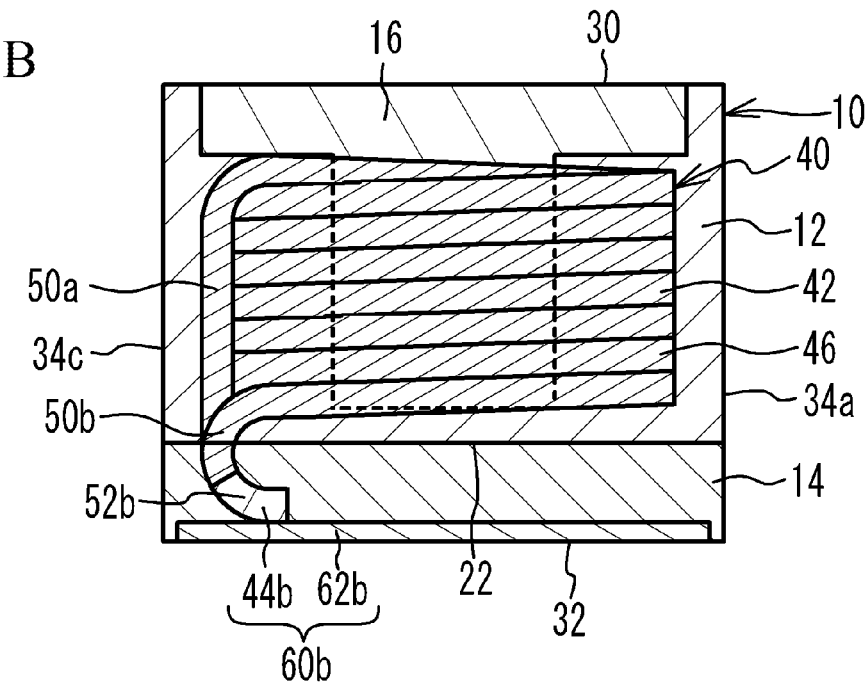

FIGS. 7A and 7B are interior perspective side views of the coil component pertaining to Variation Example 1 of Example 1. It should be noted that, in FIGS. 7A and 7B, each member is hatched for the purpose of illustrative clarity. As shown in FIGS. 7A and 7B, the coil component 110 in Variation Example 1 of Example 1 is such that the tip areas 52a, 52b, representing the non-covered parts 44a, 44b, of the lead wires 50a, 50b do not extend along the bottom face 32 of the substrate body 10. The remaining constitutions are the same as those in Example 1 and therefore not explained.

The tip areas 52a, 52b, representing the non-covered parts 44a, 44b, of the lead wires 50a, 50b may be joined to the metal members 62a, 62b by extending along the bottom face 32 of the substrate body 10, as in Example 1, or they may be joined to the metal members 62a, 62b without extending along the bottom face 32 of the substrate body 10, as in Variation Example 1 of Example 1.

Example 2

Figure 8A:
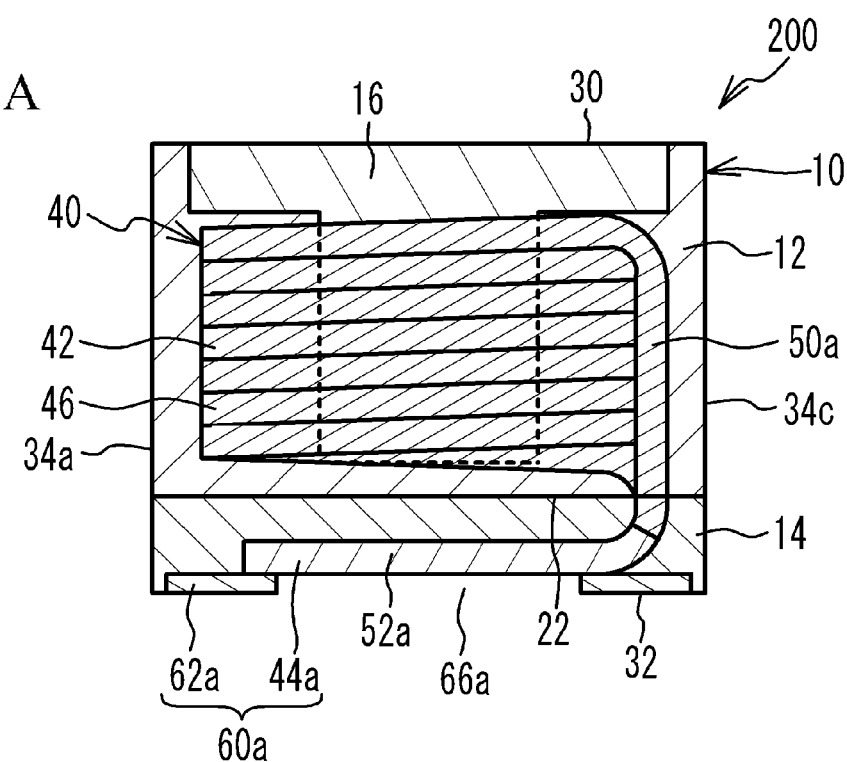
FIGS. 8A and 8B are interior perspective side views of the coil component pertaining to Example 2.
Figure 8B:
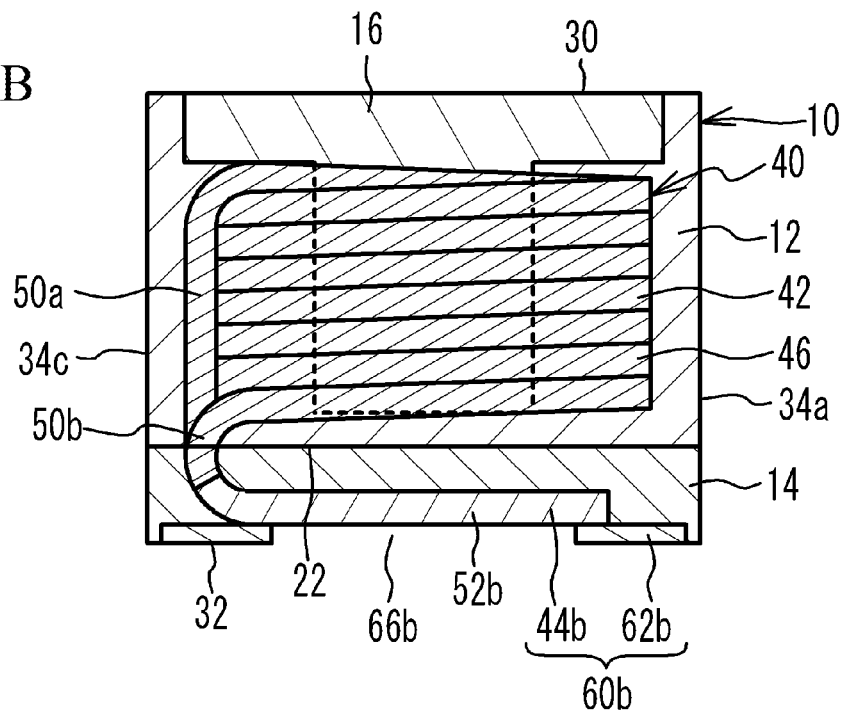

FIGS. 8A and 8B are interior perspective side views of the coil component pertaining to Example 2. It should be noted that, in FIGS. 8A and 8B, each member is hatched for the purpose of illustrative clarity. As shown in FIGS. 8A and 8B, the coil component 200 in Example 2 is such that its metal member 62a has an opening 66a at a position overlapping with the tip area 52a, representing the non-covered part 44a, of the lead wire 50a in the direction crossing with the bottom face 32 of the substrate body 10 (vertical direction, for example). In the opening 66a, the non-covered part 44a of the lead wire 50a is exposed. The metal member 62b has an opening 66b at a position overlapping with the tip area 52b, representing the non-covered part 44b, of the lead wire 50b in the direction crossing with the bottom face 32 of the substrate body 10 (vertical direction, for example). In the opening 66b, the non-covered part 44b of the lead wire 50b is exposed. The remaining constitutions are the same as those in Example 1 and therefore not explained.

According to Example 2, the metal members 62a, 62b have the openings 66a, 66b at positions overlapping with the non-covered parts 44a, 44b of the lead wires 50a, 50b. This means that, when the coil component 200 is mounted on a circuit board using solder, the mounting solder is directly joined to the lead wires 50a, 50b, and consequently the reliability of connection between the lead wires 50a, 50b and the circuit board can be improved.

Example 3

Figure 9A:
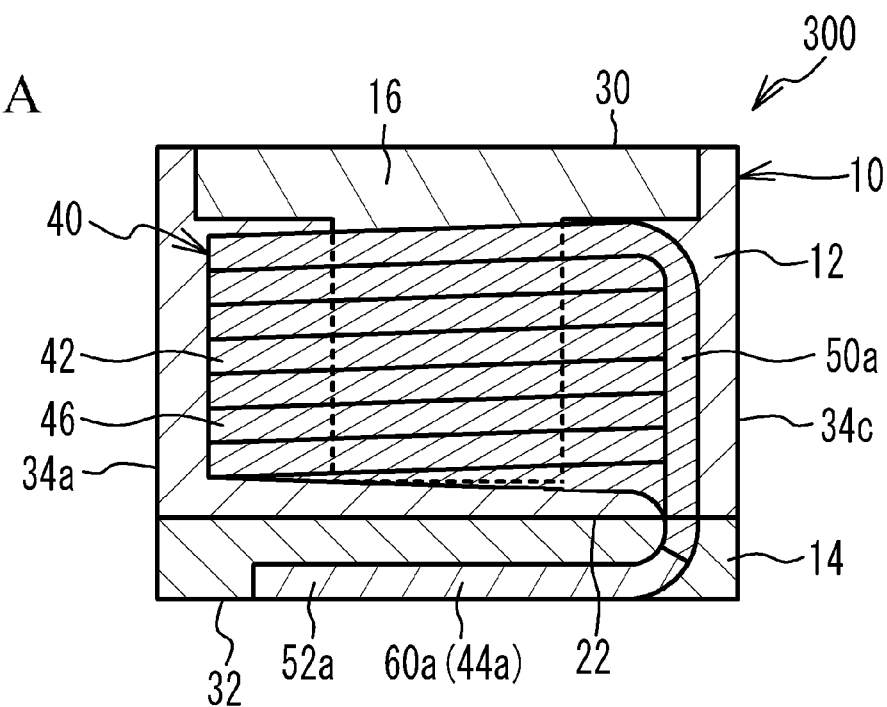
FIGS. 9A and 9B are interior perspective side views of the coil component pertaining to Example 3.
Figure 9B:
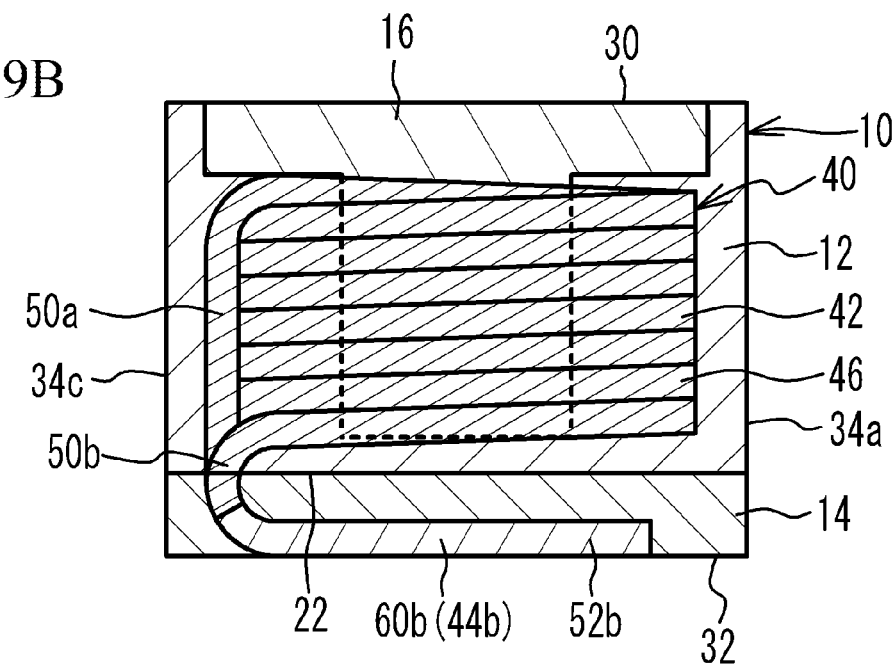

FIGS. 9A and 9B are interior perspective side views of the coil component pertaining to Example 3. It should be noted that, in FIGS. 9A and 9B, each member is hatched for the purpose of illustrative clarity. As shown in FIGS. 9A and 9B, the coil component 300 in Example 3 is such that the metal members 62a, 62b are not provided and the terminal parts 60a, 60b are constituted by the non-covered parts 44a, 44b of the lead wires 50a, 50b. Accordingly, the resin part 14 is disposed between the terminal parts 60a, 60b and the resin part 12, and the terminal parts 60a, 60b are not in contact with the resin part 12. The non-covered parts 44a, 44b of the lead wires 50a, 50b are embedded in the resin part 14 in such a way that their faces on the bottom face 32 side of the substrate body 10 are exposed from the bottom face 32 of the substrate body 10. It should be noted that, so long as their faces on the bottom face 32 side of the substrate body 10 are exposed from the bottom face 32 of the base part 10, the non-covered parts 44a, 44b of the lead wires 50a, 50b may be embedded entirely, except for the faces on the bottom face 32 side of the substrate body 10, in the resin part 14, or they may be embedded partially in the resin part 14 in their thickness direction. The faces of the non-covered parts 44a, 44b of the lead wires 50a, 50b on the bottom face 32 side of the substrate body 10 may be flush with the bottom face 32 of the substrate body 10, for example. The remaining constitutions are the same as those in Example 1 and therefore not explained.

With the coil component 300 pertaining to Example 3, the lead wires 50a, 50b are bent into the positions of terminal parts 60a, 60b during the forming process for bending the lead wires 50a, 50b as illustrated in FIGS. 3A and 3B of Example 1. The subsequent forming steps may be implemented in the same manners as the steps explained using FIGS. 4A to 4C of Example 1.

As in Example 3, the terminal parts 60a, 60b may be constituted by the non-covered parts 44a, 44b of the lead wires 50a, 50b. In this case, when the coil component 300 is mounted on a circuit board using solder, the mounting solder is directly joined to the lead wires 50a, 50b, and consequently the reliability of connection between the lead wires 50a, 50b and the circuit board can be improved.

Figure 10:
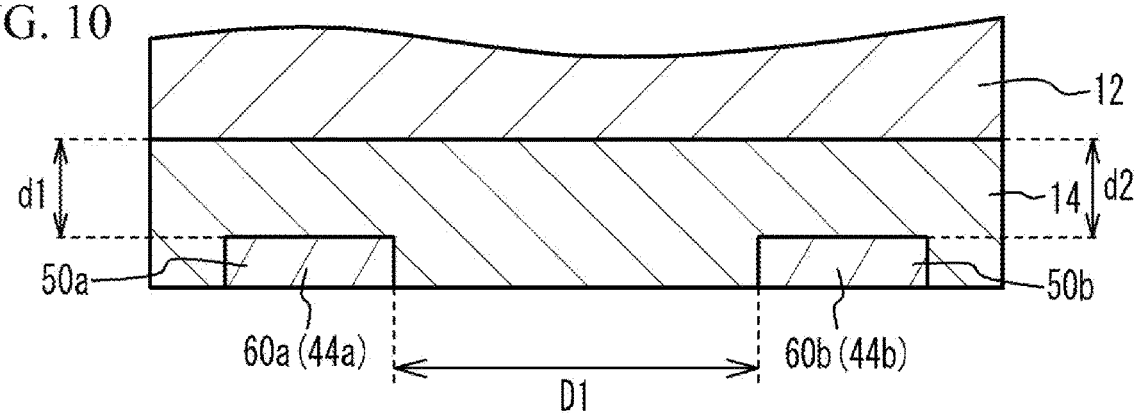
FIG. 10 is a cross-sectional view showing an enlarged detail near the terminal parts of the coil component pertaining to Example 3.

FIG. 10 is a cross-sectional view showing an enlarged detail near the terminal parts of the coil component pertaining to Example 3. As shown in FIG. 10, the shortest distance between the terminal parts 60a, 60b (i.e., between the non-covered parts 44a, 44b of the lead wires 50a, 50b) is given by D1 (mm). The shortest distance between the terminal part 60a and the resin part 12 (i.e., between the non-covered part 44a of the lead wire 50a and the resin part 12) is given by d1, while the shortest distance between the terminal part 60b and the resin part 12 (i.e., between the non-covered part 44b of the lead wire 50b and the resin part 12) is given by d2, and the sum of d1 and d2 (d1+d2) is given by D2 (mm). The dielectric strength voltage of the resin part 14 is given by R (kV/mm). The dielectric strength voltage of air is assumed as 3 (kV/mm). In this case, preferably the relationship of $(3 \times D1)/D2 < R$ (Expression (1)) is satisfied. This is for the same reason explained in Example 1.

Example 4

Figure 11A:
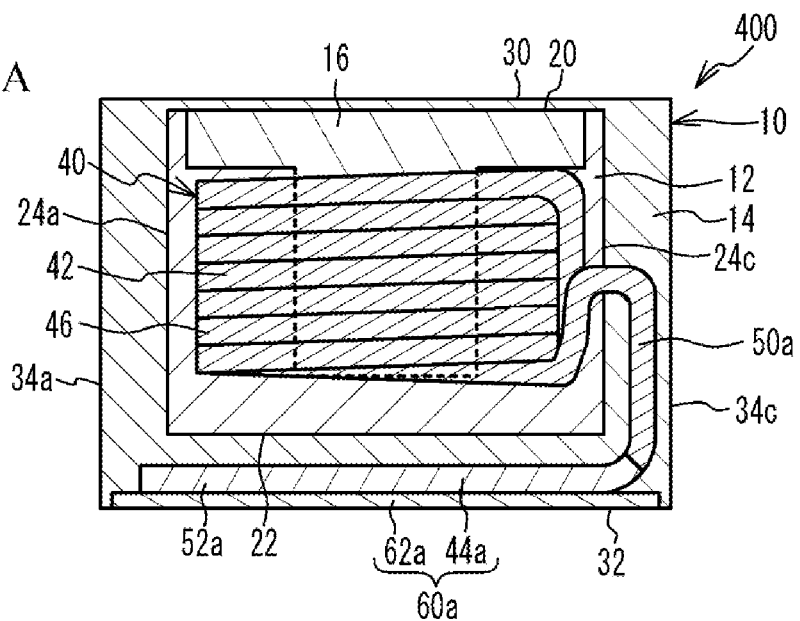
Figure 11B:
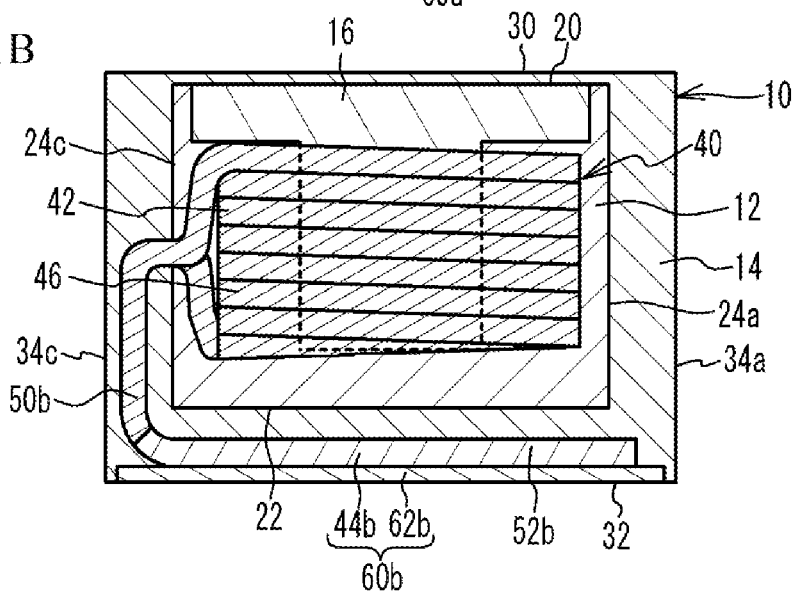
Figure 11C:
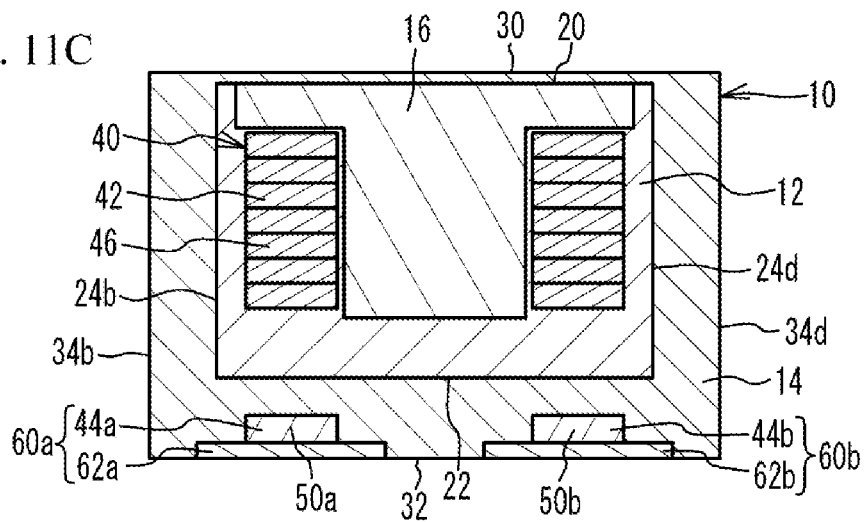
FIG. 11C is a cross-sectional view, of the coil component pertaining to Example 4.

FIGS. 11A and 11B are interior perspective side views, while FIG. 11C is a cross-sectional view, of the coil component pertaining to Example 4. It should be noted that, in FIGS. 11A and 11B, each member is hatched for the purpose of illustrative clarity. As shown in FIGS. 11A to 11C, the coil component 400 in Example 4 is such that its resin part 14 is joined to all faces of the resin part 12 including the top face 20, bottom face 22 and side faces 24a to 24d. As for the positions at which the lead wires 50a, 50b are led out from the resin part 12, the lead-out can occur at any desired position so long as it is on a face to which the resin part 14 is joined; in Example 4, the lead wires 50a, 50b are led out to the resin part 14 from the side face 24c of the resin part 12. The remaining constitutions are the same as those in Example 1 and therefore not explained. It should be noted that, while the terminal parts 60a, 60b in Example 4 are constitutionally identical to the terminal parts 60a, 60b in Example 1, they may be constitutionally identical to the terminal parts 60a, 60b in Example 2 or 3.

FIGS. 12A to 14B are drawings showing how the coil component pertaining to Example 4 is manufactured. It should be noted that, for the purpose of illustrative clarity, the covered part 46 of the conductive wire 42 where the metal wire is covered with the insulating film is hatched in FIGS. 12A and 12B, while each member is hatched in FIGS. 13A to 14B. As shown in FIGS. 12A and 12B, a conductive wire 42 constituted by a rectangular wire is wound edgewise to form a coil 40, and two lead wires 50a, 50b running straight and roughly parallel to each other are led out from the coil 40 by an appropriate length. Next, a forming process is performed where the lead wires 50a, 50b are bent. Next, a core 16 having an axis of winding 17 and a flange part 18 is installed in the coil 40, with the axis of winding 17 inserted into the hollow core part of the coil 40.

Figure 13A:
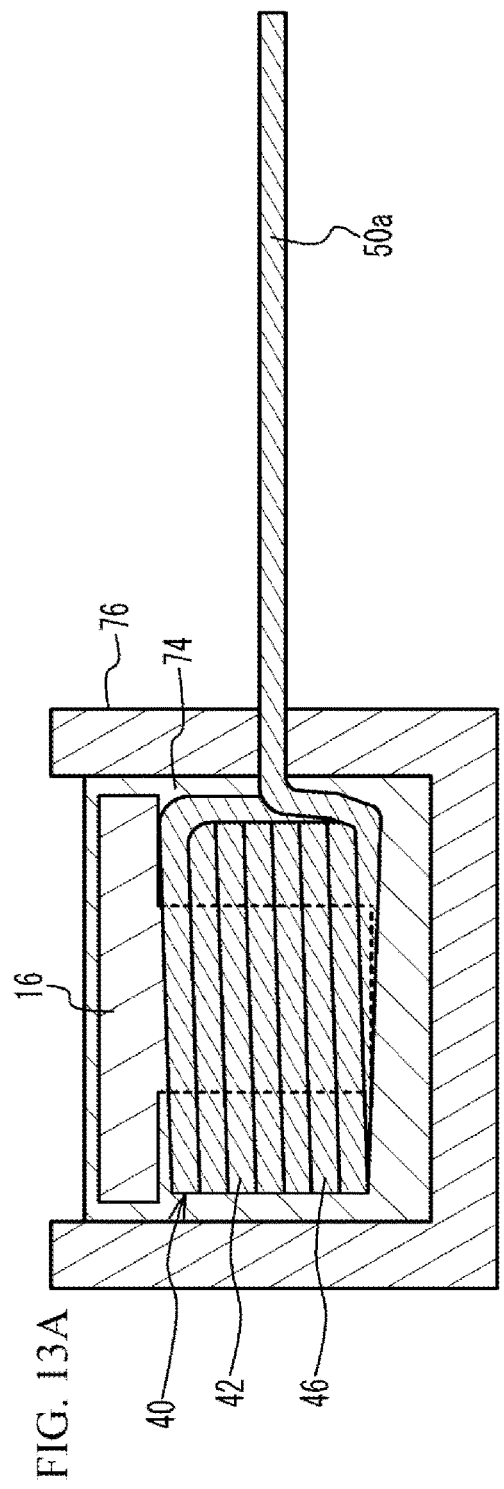
FIGS. 13A and 13B are drawings (Part 2) showing how the coil component pertaining to Example 4 is manufactured.

As shown in FIG. 13A, the coil 40 in which the core 16 has been installed is set in a die 76. Then, a magnetic-grain-containing liquid resin for forming resin part 12 is injected into the die 76 using a dispenser, and the like. At this time, the magnetic-grain-containing liquid resin is injected until the core 16 is completely embedded. Thereafter, the magnetic-grain-containing liquid resin that has been filled in the die 76 is tentatively cured. The tentative curing may be implemented under the condition of maintaining 150° C. for 5 minutes, for example. This way, a resin layer 74, where the magnetic-grain-containing liquid resin that has been filled in the die 76 is held in shape, is formed.

Figure 13B:
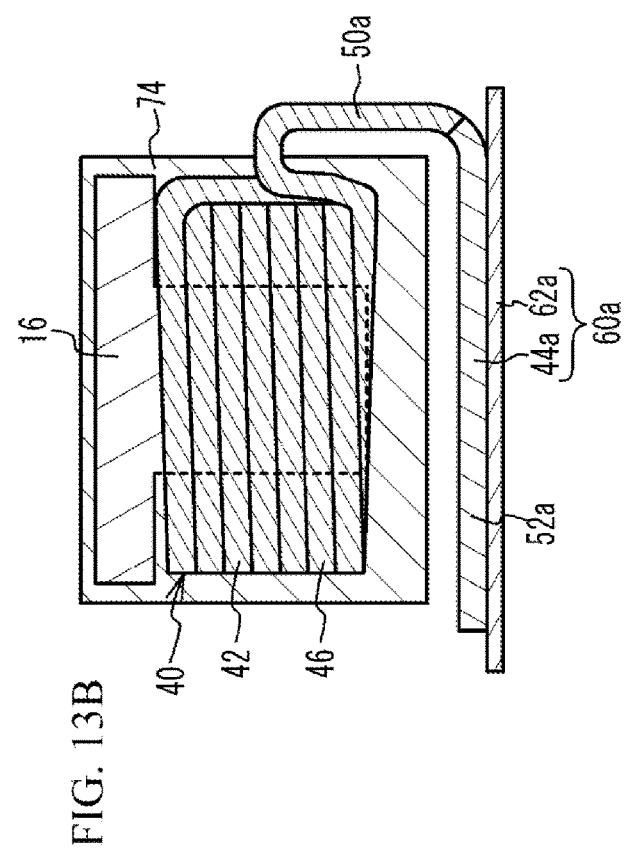

As shown in FIG. 13B, the coil 40 covered with the resin layer 74 is taken out of the die 76, after which the insulating film is stripped at the tip areas 52a, 52b of the lead wires 50a, 50b to produce non-covered parts 44a, 44b where the metal wire is exposed. Next, a forming process is performed where the lead wires 50a, 50b are bent, after which metal members 62a, 62b are joined to the tip areas 52a, 52b, representing the non-covered parts 44a, 44b, of the lead wires 50a, 50b. The non-covered parts 44a, 44b of the lead wires 50a, 50b and metal members 62a, 62b joined to the non-covered parts 44a, 44b become terminal parts 60a, 60b.

Figure 14A:
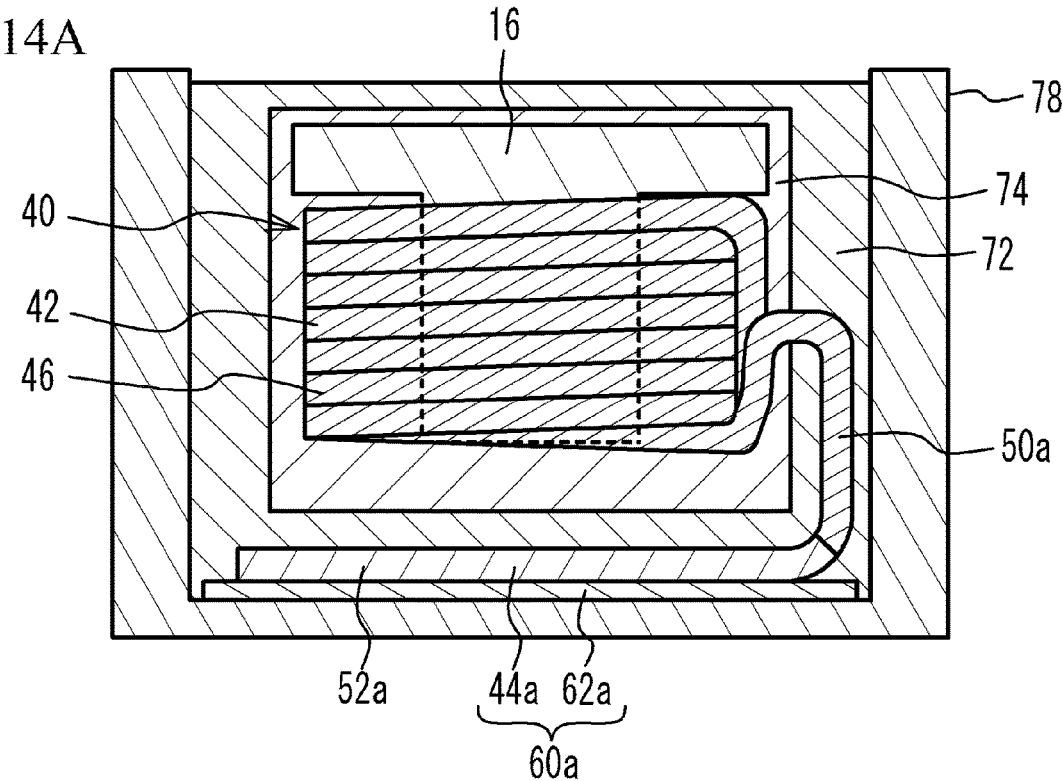
FIGS. 14A and 14B are drawings (Part 3) showing how the coil component pertaining to Example 4 is manufactured.

As shown in FIG. 14A, the coil 40 having the metal members 62a, 62b joined to the non-covered parts 44a, 44b of the lead wires 50a, 50b is set in a die 78. Then, a liquid resin for forming resin part 14 is injected into the die 78 using a dispenser, and the like. At this time, the liquid resin is injected until the resin layer 74 is completely embedded. Thereafter, the liquid resin that has been filled in the die 78 is tentatively cured. The tentative curing may be implemented under the condition of maintaining 150° C. for 5 minutes, for example. This way, a resin layer 72, where the liquid resin for forming resin part 14 is held in shape, is formed.

Figure 14B:
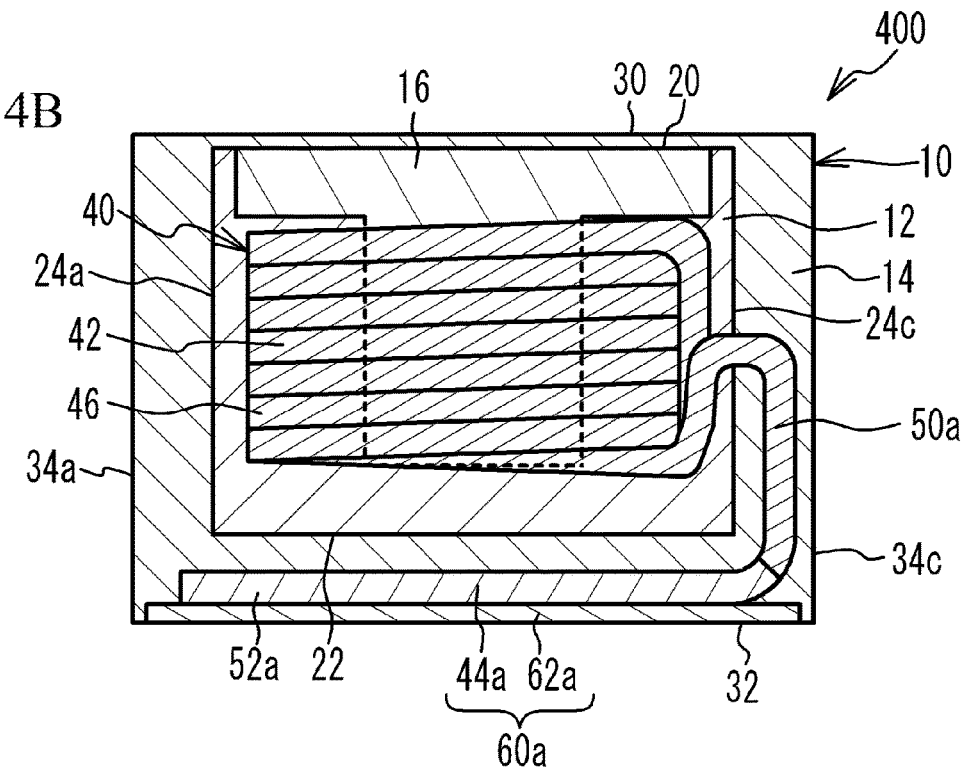

As shown in FIG. 14B, the molded body is taken out of the die 78, after which the resin layers 72, 74 are finally cured. The final curing may be performed under conditions involving higher temperatures and longer times compared to the tentative curing; for example, it may be performed under the condition of maintaining 180° C. for 60 minutes. This way, a coil component 400 is formed that comprises an integrally-molded substrate body 10 which, in turn, comprises a resin part 12 in which the core 16 and coil 40 have been embedded, and a resin part 14 in which the terminal parts 60a, 60b constituted by the non-covered parts 44a, 44b of the lead wires 50a, 50b, and also by the metal members 62a, 62b have been embedded. It should be noted that, while the manufacturing method described here is a manufacturing method using a thermosetting resin, a thermoplastic resin may also be used in Example 4 according to a manufacturing method similar to the one in Example 1.

According to Example 4, the resin part 14 is joined to the top face 20, bottom face 22, and side faces 24a to 24c of the resin part 12, as shown in FIGS. 11A to 11C. As a result, the joining area of the resin parts 12, 14 becomes larger and their joining strength can be increased. It should be noted that, although most preferably the resin part 14 is joined to all of the top face 20, bottom face 22 and side faces 24a to 24c of the resin part 12 from the viewpoint of joining strength, it may be joined to at least two faces, or to the bottom face 22 and side faces 24a to 24c.

Figure 15:
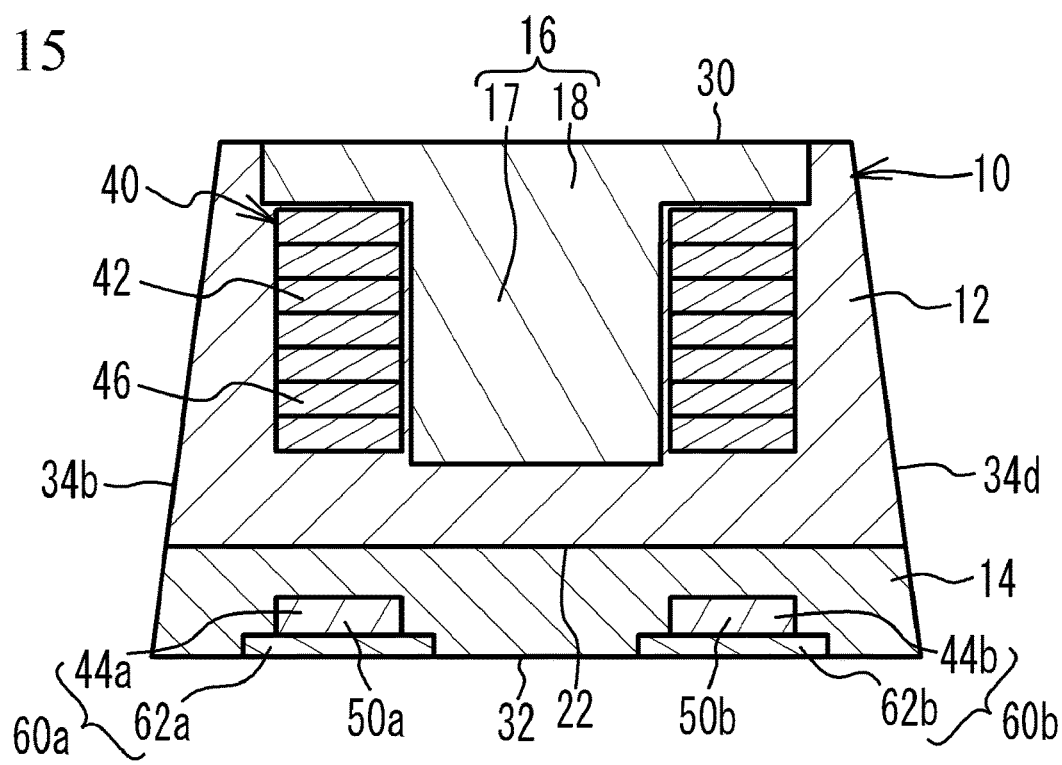
FIG. 15 is a cross-sectional view showing a substrate body whose side faces are tapered.

It should be noted that, while the lead wires 50a, 50b are routed inside the substrate body 10 in Examples 1 to 4, they may be routed outside the substrate body 10. Also, the side faces of the substrate body 10 are not limited to being vertical, and they may be tapered in a manner expanding from the top face 30 toward the bottom face 32. FIG. 15 is a cross-sectional view showing a base part whose side faces are tapered. Tapering makes it easier, when a die having an opening area on the wider side of taper or die that permits opening/closing of the wider side of taper is used, to remove the molded body from the die 70.

Example 5

FIG. 16A is a perspective view of the coil component pertaining to Example 5, while FIG. 16B is a view of cross-section A-A in FIG. 16A. As shown in FIGS. 16A and 16B, the coil component 500 in Example 5 is such that its substrate body 10 is formed with the resin part 14 joined to all of the top face 20, bottom face 22, and side faces 24a to 24d, of the resin part 12. The core 16 is not embedded in the resin part 12. The lead wires 50a, 50b are led out from the coil 40 toward the bottom face 32 of the substrate body 10. The tip areas 52a, 52b, representing the non-covered parts 44a, 44b, of the lead wires 50a, 50b are exposed from the resin part 14 on the bottom face 32 of the substrate body 10. The metal members 62a, 62b are joined to the non-covered parts 44a, 44b of the lead wires 50a, 50b exposed from the resin part 14, to form the terminal parts 60a, 60b.

The terminal part 60a extends from the bottom face 32, via the side face 34a, to the top face 30, of the substrate body 10 and also covers parts of the side faces 34b, 34d. The terminal part 60b extends from the bottom face 32, via the side face 34c, to the top face 30, of the substrate body 10 and also covers parts of the side faces 34b, 34d. In other words, the terminal parts 60a, 60b cover five faces of the substrate body 10. It should be noted that the terminal parts 60a, 60b may extend from the bottom face 32, via the side face 34a or 34c, to the top face 30, of the substrate body 10, thereby covering three faces of the substrate body 10. The remaining constitutions are the same as those in Example 1 and therefore not explained.

Example 6

FIG. 17A is a cross-sectional view of the coil component pertaining to Example 6, while FIG. 17B is a cross-sectional view of the coil component pertaining to Variation Example 1 of Example 6. As shown in FIG. 17A, the coil component 600 in Example 6 is different from the coil component 100 in Example 1 in that the core 16a it uses is a drum core having flange parts 18a, 18b provided at both axial-direction ends of an axis of winding 17. The remaining constitutions are the same as those of the coil component 100 in Example 1 and therefore not explained. As shown in FIG. 17B, the coil component 610 in Variation Example 1 of Example 6 is different from the coil component 600 in Example 6 in that its core 16a is tilted by 90°.

Example 7

Figure 18A:
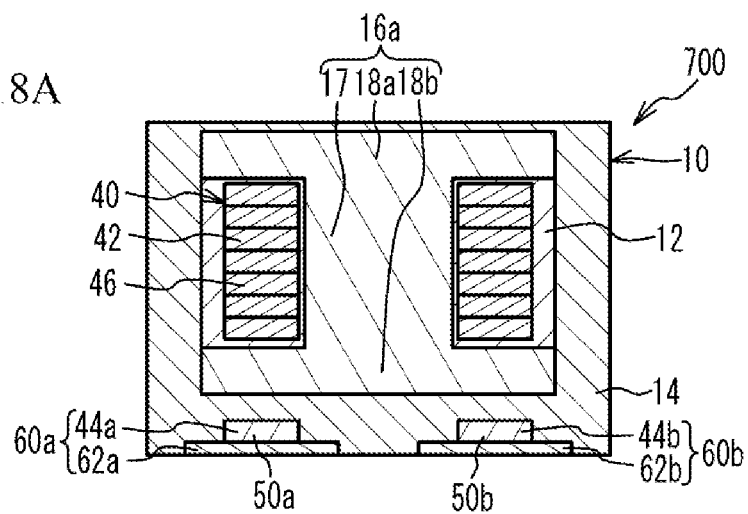
FIGS. 18A to 18D are cross-sectional view of the coil components pertaining to Example 7 to Variation Example 3 of Example 7.
Figure 18B:
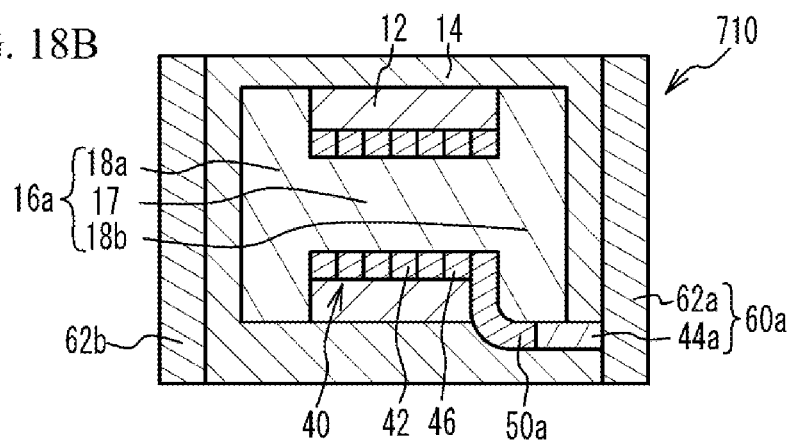
Figure 18C:
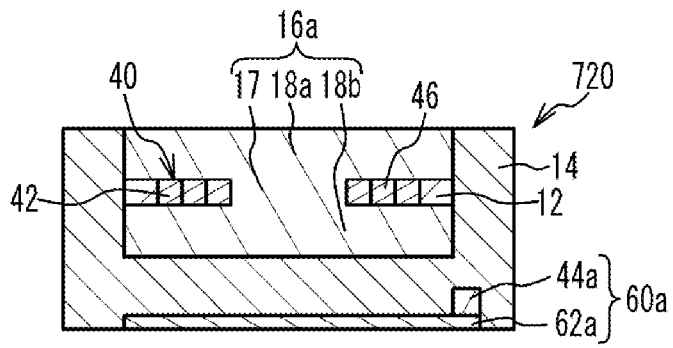
Figure 18D:
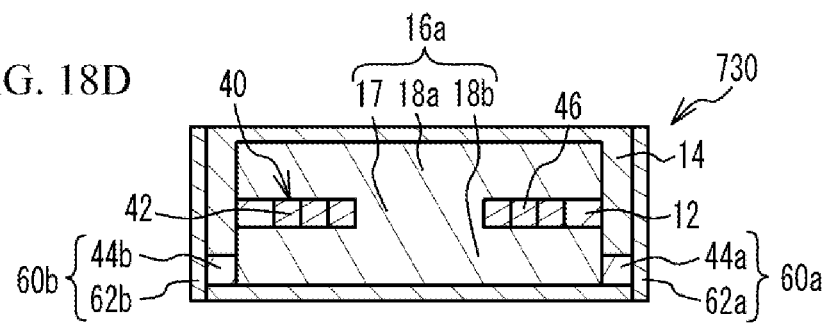

FIG. 18A is a cross-sectional view of the coil component pertaining to Example 7, FIG. 18B is a cross-sectional view of the coil component pertaining to Variation Example 1 of Example 7, FIG. 18C is a cross-sectional view of the coil component pertaining to Variation Example 2 of Example 7, and FIG. 18D is a cross-sectional view of the coil component pertaining to Variation Example 3 of Example 7. As shown in FIG. 18A, the coil component 700 in Example 7 is different from the coil component 400 in Example 4 in that the core 16a it uses is a drum core having flange parts 18a, 18b provided at both axial-direction ends of an axis of winding 17. The remaining constitutions are the same as those of the coil component 400 in Example 4 and therefore not explained.

As shown in FIG. 18B, the coil component 710 in Variation Example 1 of Example 7 is different from the coil component 700 in Example 7 in that its core 16a is tilted by 90° and its metal members 62a, 62b are provided separately on both side faces of the resin part 14. As shown in FIG. 18C, the coil component 720 in Variation Example 2 of Example 7 is different from the coil component 700 in Example 7 in that its core 16a has a shorter axis of winding 17 and only one coil 40 layer is wound around the axis of winding 17. As shown in FIG. 18D, the coil component 730 in Variation Example 3 of Example 7 is different from the coil component 700 in Example 7 in that its core 16a has a shorter axis of winding 17, only one coil 40 layer is wound around the axis of winding 17, and its metal members 62a, 62b are provided separately on both side faces of the resin part 14.

Example 8

Figure 19A:
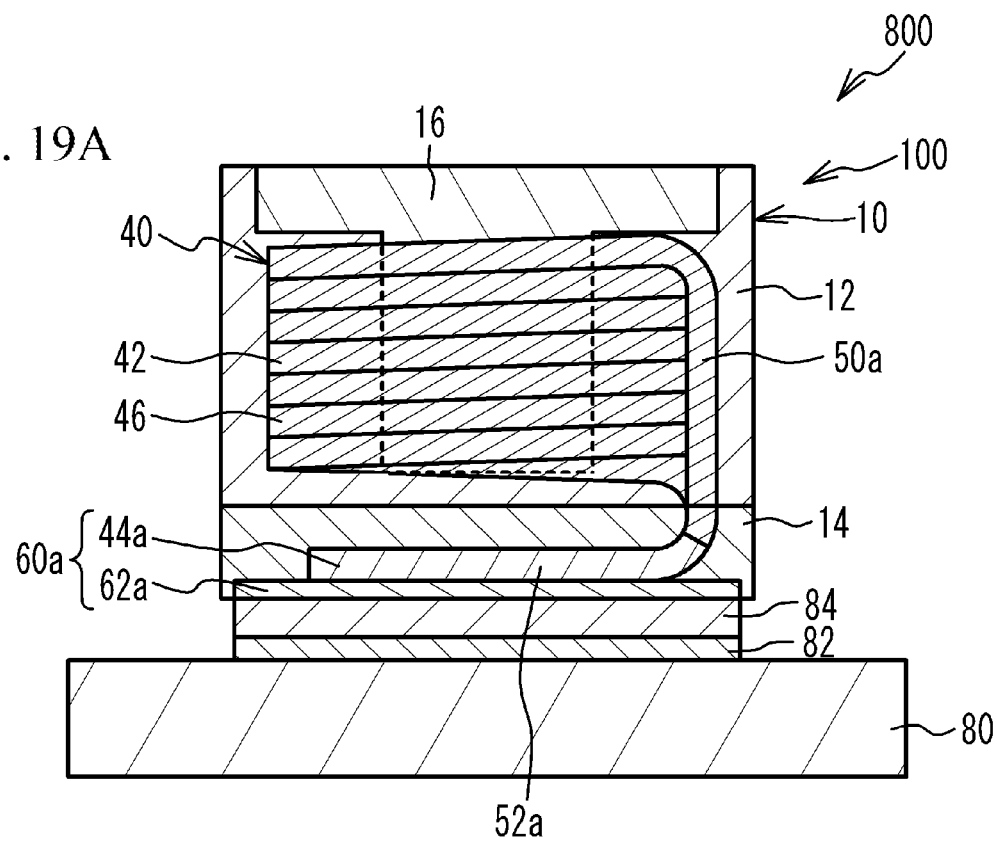
FIGS. 19A and 19B are interior perspective side views of the electronic device pertaining to Example 8.
Figure 19B:
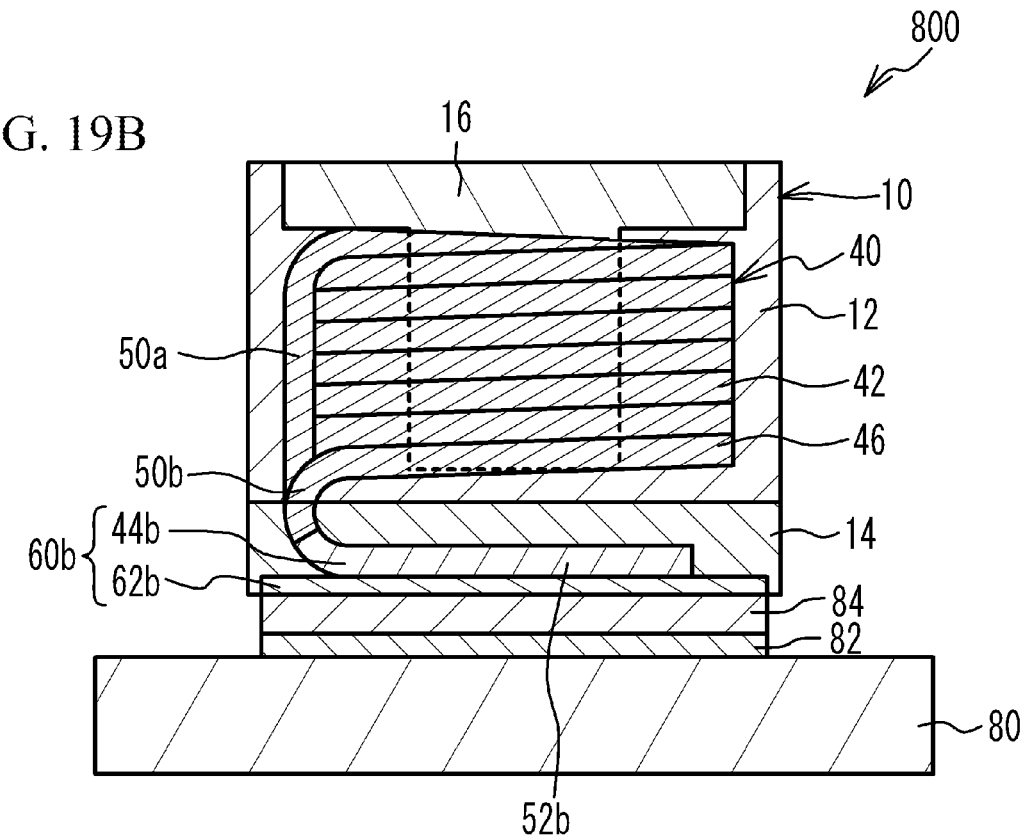

FIGS. 19A and 19B are interior perspective side views of the electronic device pertaining to Example 8. It should be noted that each member is hatched in FIGS. 19A and 19B for the purpose of illustrative clarity. As shown in FIGS. 19A and 19B, the electronic device 800 in Example 8 comprises a circuit board 80 and the coil component 100 in Example 1 that has been mounted on the circuit board 80. The coil component 100 is mounted on the circuit board 80 as a result of the joining, to the electrode 82 on the circuit board 80 via solder 84, of the terminal parts 60a, 60b constituted by the non-covered parts 44a, 44b of the lead wires 50a, 50b and metal members 62a, 62b joined to the non-covered parts 44a, 44b.

According to the electronic device 800 in Example 8, the coil component 100 in Example 1 is mounted on a circuit board 80. This way, an electronic device 800 having a coil component 100 that prevents shorting between its terminal parts 60a, 60b, can be obtained. It should be noted that, while Example 8 illustrated an example where the coil component 100 in Example 1 is mounted on a circuit board 80, any of the coil components in Variation Example 1 of Example 1 to Variation Example 3 of Example 7 may be mounted.

The foregoing described the examples of the present invention in detail; however, the present invention is not limited to these specific examples and a number of different variations and modifications are possible to the extent that doing so does not deviate from the key points of the present invention as described in What Is Claimed Is. For example, other examples include forming a coil by means of plating to produce a flat coil, as well as forming each resin part as a layer by means of printing or sheet forming, as they permit production of particularly thin coil components.

I claim:

1. A coil component, comprising:
   a substrate body having a first resin part formed by a resin that contains magnetic grains, and a second resin part joined to a surface of the first resin part and formed by a material that contains resin, and whose insulation property is higher than that of the first resin part;
   a coil embedded in the first resin part and formed by a conductor having an insulating film;
   leader parts formed by the conductor and led out from the coil to the second resin part; and
   terminal parts connected electrically to the leader parts;
   wherein covered parts of the leader parts, which are covered with the insulating film, are embedded partially in the second resin part, and the second resin part is disposed between the terminal parts and the first resin part.

2. The coil component according to claim 1, wherein the coil component has a pair of the terminal parts, and a relationship of $(3 \times D1/D2) < R$ is satisfied, where:
   a shortest distance between the pair of terminal parts is given by $D1$ (mm);
   a sum of a shortest distance between one of the pair of terminals and the first resin part, and a shortest distance between the other terminal part and the first resin part, is given by $D2$ (mm); and
   a dielectric strength voltage of the second resin part is given by $R$ (kV/mm).

3. The coil component according to claim 1, wherein the terminal parts are constituted by non-covered parts of the leader parts which are not covered with the insulating film, and metal members joined to the non-covered parts.

4. The coil component according to claim 1, wherein the terminal parts are constituted by non-covered parts of the leader parts which are not covered with the insulating film.

5. The coil component according to claim 1, wherein the leader parts penetrate through a boundary between the first resin part and the second resin part at the covered part which is covered with the insulating film.

6. The coil component according to claim 1, wherein the terminal parts are embedded in the second resin part.

7. The coil component according to claim 1, wherein the first resin part is formed by the resin that contains metal magnetic grains.

8. The coil component according to claim 1, wherein the second resin part is formed by a resin that does not contain magnetic grains.

9. The coil component according to claim 1, wherein the substrate body is such that the second resin part is joined to at least two faces among surfaces of the first resin part.

10. The coil component according to claim 1, wherein the substrate body is formed by integrally molding the first resin part and the second resin part.

11. An electronic device, comprising:
    the coil component according to claim 1; and
    a circuit board on which the coil component has been mounted.

* * * * *